(12) United States Patent
Schubert et al.

(10) Patent No.: US 9,917,232 B2
(45) Date of Patent: *Mar. 13, 2018

(54) MONOLITHIC IMAGE CHIP FOR NEAR-TO-EYE DISPLAY

(71) Applicant: GLO AB, Lund (SE)

(72) Inventors: Martin Schubert, Sunnyvale, CA (US); Daniel Bryce Thompson, Walnut Creek, CA (US); Michael Grundmann, Sunnyvale, CA (US); Nathan Gardner, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/443,619

(22) Filed: Feb. 27, 2017

(65) Prior Publication Data

US 2017/0170372 A1 Jun. 15, 2017

Related U.S. Application Data

(63) Continuation of application No. 14/865,459, filed on Sep. 25, 2015, now Pat. No. 9,620,559.
(Continued)

(51) Int. Cl.
*H01L 33/50* (2010.01)
*H01L 27/15* (2006.01)

(52) U.S. Cl.
CPC .......... *H01L 33/507* (2013.01); *H01L 27/153* (2013.01); *H01L 33/502* (2013.01)

(58) Field of Classification Search
CPC . G02F 2202/36; H01L 27/15; H01L 33/0062; H01L 33/06; H01L 33/30; H01L 27/153; H01L 33/502; H01L 33/507
See application file for complete search history.

(56) References Cited

U.S. PATENT DOCUMENTS 8,350,251 B1   1/2013 Lowgren et al.
8,669,125 B2   3/2014 Lowgren et al.
(Continued)

FOREIGN PATENT DOCUMENTS

CN          188630 A       12/2006
JP       2007116097 A        5/2007
(Continued)

OTHER PUBLICATIONS

International Preliminary Report on Patentability and Written Opinion of the International Searching Authority for International Patent Application No. PCT/US2015/052318, dated Apr. 6, 2017, 7 pages.
(Continued)

*Primary Examiner* — Allan R Wilson
(74) *Attorney, Agent, or Firm* — The Marbury Law Group PLLC

(57) ABSTRACT

A set of light emitting devices can be formed on a substrate. A growth mask having a first aperture in a first area and a second aperture in a second area is formed on a substrate. A first nanowire and a second nanowire are formed in the first and second apertures, respectively. The first nanowire includes a first active region having a first band gap and a second active region having a second band gap. The first band gap is greater than the second band gap. The second nanowire includes an active region having the first band gap and does not include, or is adjoined to, any material having the second band gap.

6 Claims, 18 Drawing Sheets

Related U.S. Application Data

(60) Provisional application No. 62/055,913, filed on Sep. 26, 2014.

(56) References Cited

U.S. PATENT DOCUMENTS

| | | | |
|---|---|---|---|
| 9,054,233 | B2 | 6/2015 | Ohlsson et al. |
| 9,537,062 | B2* | 1/2017 | Hagelaar ............ H01L 25/0753 |
| 9,564,557 | B2* | 2/2017 | Weiler ................. H01L 33/504 |
| 2005/0082543 | A1 | 4/2005 | Alizadeh et al. |
| 2005/0227391 | A1 | 10/2005 | Jin et al. |
| 2007/0041214 | A1 | 2/2007 | Ha et al. |
| 2008/0012030 | A1 | 1/2008 | Yoon et al. |
| 2008/0036038 | A1 | 2/2008 | Hersee et al. |
| 2008/0149946 | A1 | 6/2008 | Kim et al. |
| 2009/0189144 | A1 | 7/2009 | Quitoriano et al. |
| 2010/0006817 | A1 | 1/2010 | Ohlsson et al. |
| 2012/0135260 | A1 | 5/2012 | Jang et al. |
| 2014/0131750 | A1 | 5/2014 | Peng et al. |
| 2014/0134769 | A1 | 5/2014 | Kim et al. |
| 2014/0285088 | A1* | 9/2014 | Windisch ............ H01L 25/0753 315/113 |
| 2016/0093665 | A1 | 3/2016 | Schubert et al. |
| 2016/0284949 | A1* | 9/2016 | Hagelaar ............ H01L 25/0753 |
| 2016/0351144 | A1* | 12/2016 | Park ..................... G09G 3/3648 |

FOREIGN PATENT DOCUMENTS

| | | |
|---|---|---|
| JP | 2009049209 A | 3/2009 |
| KR | 100857410 B1 | 9/2008 |
| WO | WO2007102781 A1 | 9/2007 |
| WO | WO2008079079 A1 | 7/2008 |
| WO | WO2010014032 A1 | 2/2010 |
| WO | WO2011160051 A2 | 12/2011 |
| WO | WO2014197799 A1 | 12/2014 |

OTHER PUBLICATIONS

Hong et al., "Visible-Color-Tunable Light-Emitting Diodes," Adv. Mater. 2011, XX, 1-5.

Funato et al., "Monolithic Polychromatic Light-Emitting Diodes Based on InGaN Microfacet Quantum Wells Toward Tailor-Made Solid-State Lighting," Applied Physics Express, 1 (2008), Jan. 11, 2006.

Ueda et al., "Mechanisms of Metalorganic Vapor Phase Epitaxy of InGaN Quantum Wells on GaN Microfacet Structures," Phys. Stat. Sol. (c) 4, No. 7, 2826-2829 (2007).

Neubert et al., "Dependence of In Mole Fraction in InGaN Facets," Phys. Stat. Sol. vol. 4, No. 7, pp. 2383-2386, (2007).

International Application No. PCT/US2011/040932, International Preliminary Report on Patentability, dated Jan. 3, 2013.

International Application No. PCT/US2014/041308, International Search Report and Written Opinion, dated Oct. 1, 2014, 10pgs.

International Application No. PCT/US2015/052318, International Search Report and Written Opinion, dated Jan. 8, 2016, 10pgs.

* cited by examiner

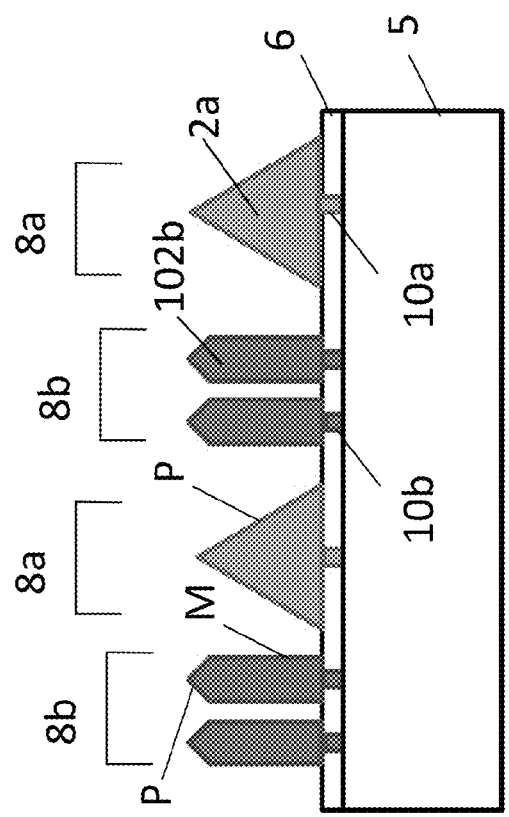
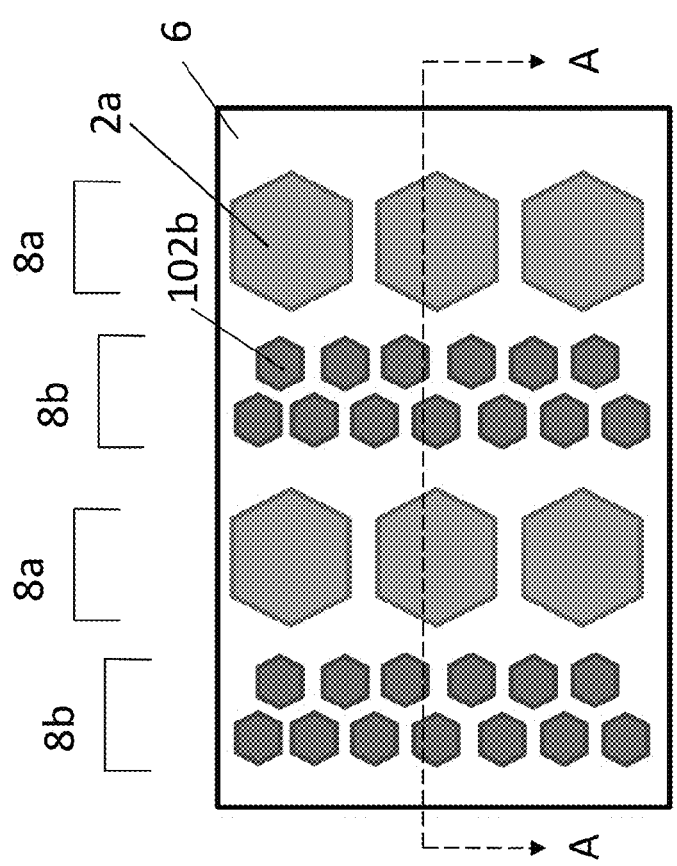

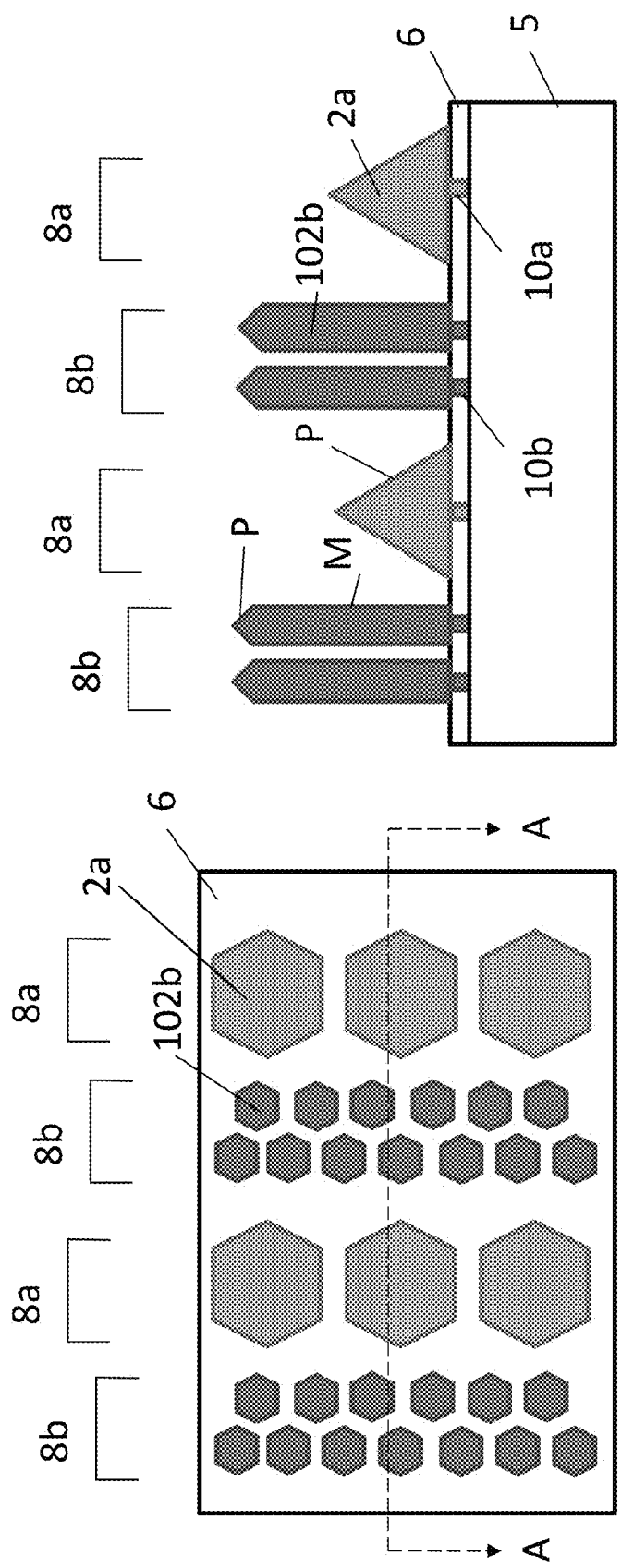

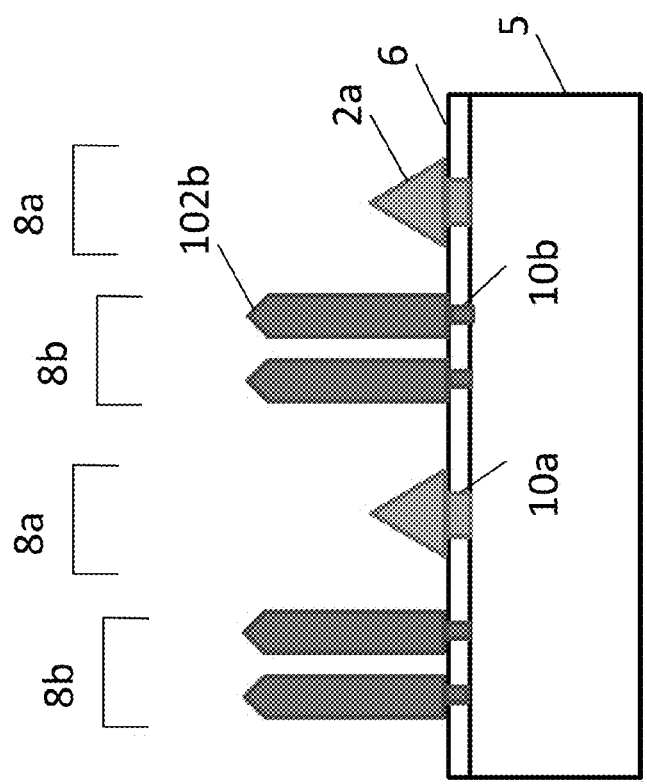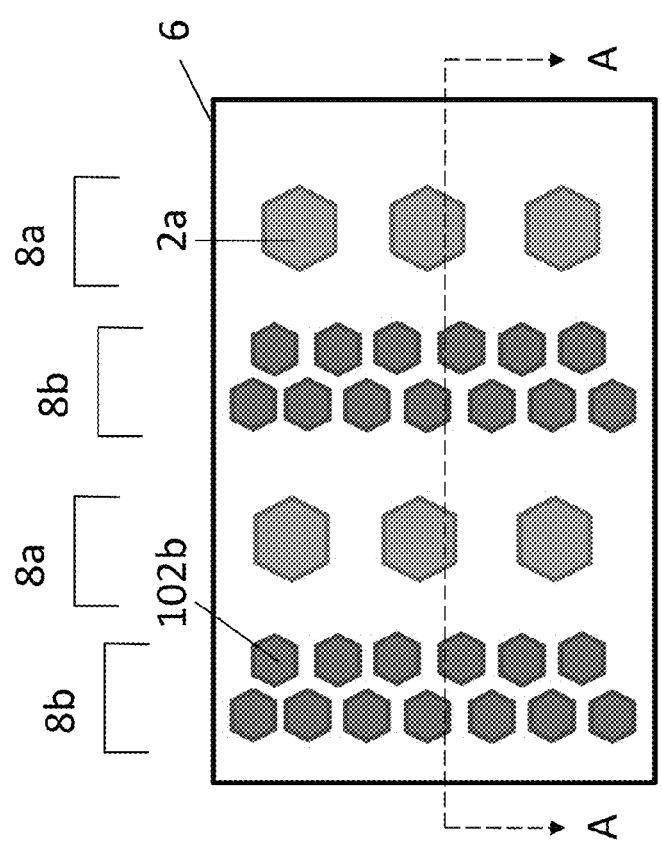

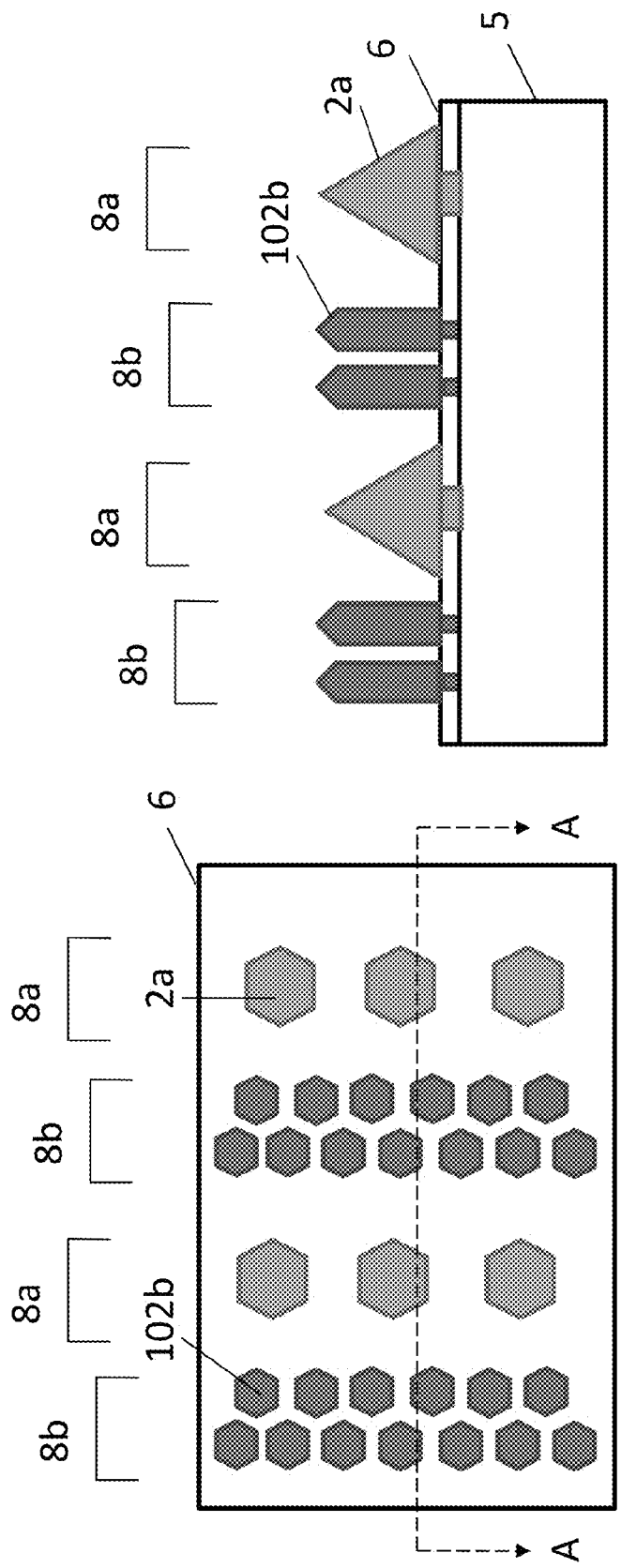

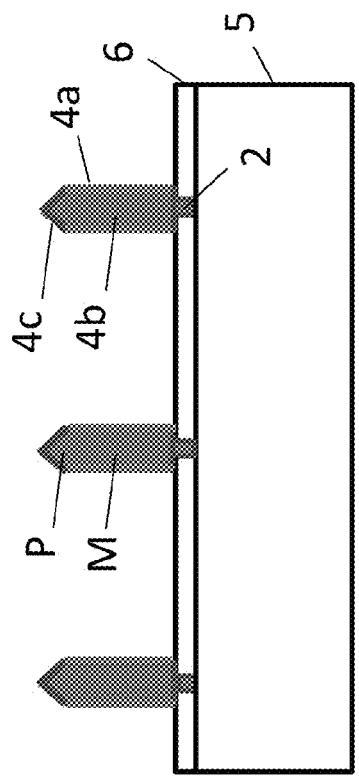
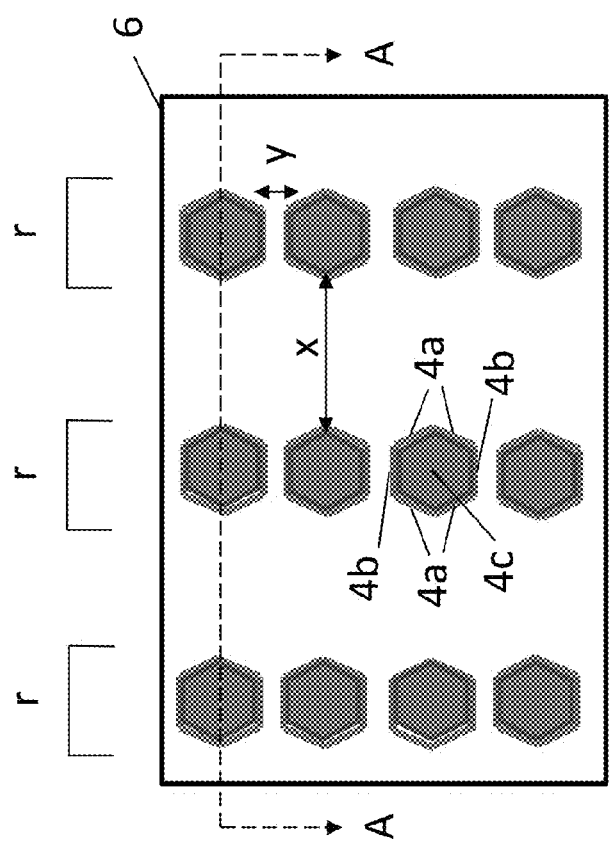
Fig. 8B
Fig. 8A

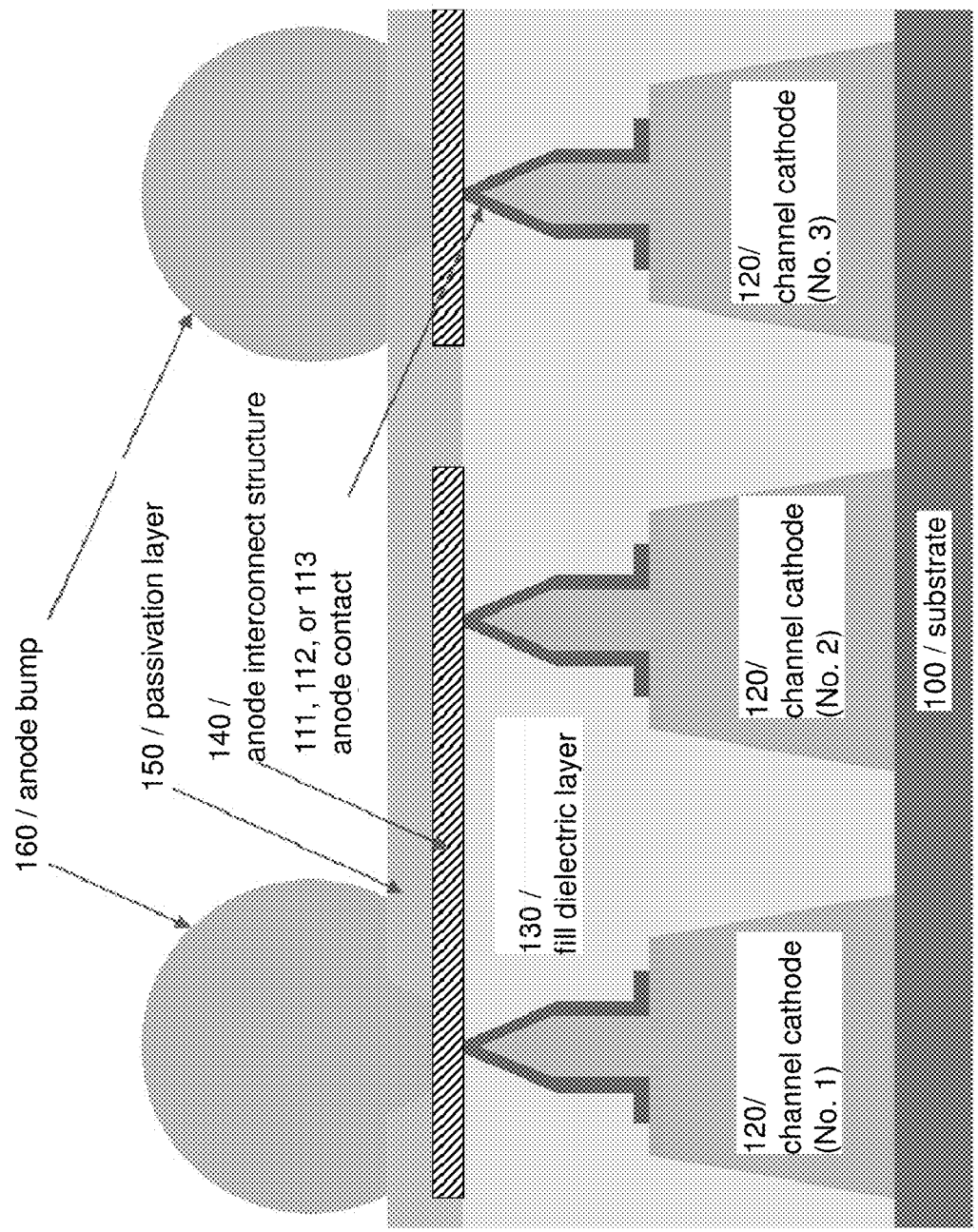

MONOLITHIC IMAGE CHIP FOR NEAR-TO-EYE DISPLAY

FIELD

The present disclosure relates to arrays of light emitting diodes (LEDs) and in particular to arrays capable of emitting light of at least two different wavelengths. It also relates to methods of fabricating such arrays. Further, the disclosure provides a monolithic substrate having an array of emissive subpixels of at least two types, with each type emitting light of a different color. Such a substrate is termed an image chip. With three subpixel types and corresponding colors that are approximately red, green, and blue, the subpixel array on the image chip is capable of displaying full-color images.

BACKGROUND

For light emitting devices, such as light emitting diodes (LED), the emission wavelength is determined by the band gap of the active region of the LED together with thickness determined confinement effects. Often the active region includes one or more quantum wells (QW). For III-nitride based LED devices, such as GaN based devices, the active region (e.g. quantum well) material is preferably ternary, such as $In_xGa_{1-x}N$, where $0<x<1$.

The band gap of such III-nitride is dependent on the amount of In incorporated in the active region (e.g., in the QW(s)). Higher In incorporation will yield a smaller band gap and thus longer wavelength of the emitted light. As used herein, the term "wavelength" refers to the peak emission wavelength of the LED. It should be understood that a typical emission spectra of a semiconductor LED is a narrow band of wavelength centered around the peak wavelength.

Multi-color LED arrays in the prior art suffer from several drawbacks. Some multi-color LEDs form nanowire LEDs which emit different color light (i.e. different wavelength) from different portions of the same nanowire, which makes it difficult to control and selectively activate the different emission wavelengths from the same nanowire LED.

SUMMARY

Embodiments include a semiconductor structure including light emitting devices includes a first light emitting device containing a first nanowire located on a substrate, where the first nanowire includes a first active region, the first active region including a first lower active region having a first band gap and a first upper active region having a second band gap, where the first band gap is greater than the second band gap, and a second light emitting device containing a second nanowire located on the substrate, where the second nanowire includes a second active region having the first band gap and does not include, nor is in physical contact with, any material having the second band gap.

Further embodiments include a method of making a semiconductor structure including light emitting devices that includes forming a growth mask having a first aperture in a first area and a second aperture in a second area on a substrate, forming a first nanowire through the first aperture, where the first nanowire includes a first active region including a first lower active region and a first upper active region, the first lower active region having a first band gap and the first upper active region having a second band gap, where the first band gap is greater than the second band gap, and forming a second nanowire through the second aperture, where the second nanowire includes a second active region having the first band gap and does not include, nor is in physical contact with, any material having the second band gap.

Further embodiments include an image chip that includes a semiconductor structure including light emitting devices such as described above, where the substrate of the semiconductor structure is a monolithic substrate and the the light emitting devices constitute an array of emissive subpixels of at least two types located upon the monolithic substrate. Further embodiments relate to a method of making an image chip including a semiconductor structure including light emitting devices such as described above.

Further embodiments include a device that includes a support including at least a first area and a second area, and a plurality of first light emitting devices located over the first area of the support, each first light emitting device containing a first growth template including a first nanostructure, and each first light emitting device has a first peak emission wavelength. The device also includes a plurality of second light emitting devices located over the second area of the support. Each second light emitting device contains a second growth template including a second nanostructure, and each second light emitting device has a second peak emission wavelength different from the first peak emission wavelength. Each first growth template differs from each second growth template.

The support may be a growth substrate or a handle substrate which is attached to the device after the device is grown. Each first nanostructure may comprise a first nanowire core which comprises an inner portion or an entirety of the first growth template, each first nanowire core protrudes through a first aperture in a growth mask in the first area. Each second nanostructure may comprise a second nanowire core which comprises an inner portion or an entirety of the second growth template, each second nanowire core protrudes through a second aperture in a growth mask in the second area. Preferably, each first growth template comprises the first nanowire core and at least one first growth template layer around the first nanowire core, such that the first growth template layer extends laterally beyond the first aperture over the growth mask, and each second growth template comprises the second nanowire core and at least one second growth template layer around the second nanowire core, such that the second growth template layer extends laterally beyond the second aperture over the growth mask.

Each first and second nanowire core may comprise a first conductivity type (e.g., n-type) semiconductor material. A first active region may be located around each first nanowire core, the first active region comprising at least one first quantum well having a first band gap. A second active region may be located around each second nanowire core, the second active region comprising at least one second quantum well having a second band gap different from the first band gap. Preferably, each first and second nanowire core comprises a III-nitride semiconductor material (e.g., gallium nitride), and each first and second quantum well comprises an indium gallium nitride material.

A first junction forming element comprising a semiconductor material of a second conductivity type (e.g., p-type) different from the first conductivity type may be located around each first active region to form a p-n or p-i-n junction. A second junction forming element comprising a semiconductor material of the second conductivity type different from the first conductivity type may be located around each second active region to form a p-n or p-i-n junction.

Each first growth template may differ from each second growth template by at least one of: (a) a growth area for a respective active region, (h) a ratio of exposed growth planes, or (c) a spacing from adjacent growth templates. Each first quantum well preferably contains a different amount of indium from each second quantum well due to the difference between the first and the second growth templates. For example, each first growth template may have a nanopyramid shape and each second growth template may have a nanopillar or nanowire shape. Thus, each first growth template may have a larger p-plane facet area contacting the first active region than a p-plane facet area of the second growth template contacting the second active region. In this example, this may lead to each first quantum well containing a higher amount of indium and a lower peak emission wavelength than each second quantum well due to the difference in the p-plane facet area between the first and the second growth templates.

In another embodiment, each first aperture has a substantially equal width or diameter to each second aperture, each first aperture is spaced further apart from adjacent first apertures than each second aperture is spaced apart from adjacent second apertures, and each first, growth template has a substantially equal or smaller growth area contacting the first active region than a growth area of each second growth template contacting the second active region.

In another embodiment, a plurality of third light emitting devices are also located over a third area of the support, each third light emitting device has a third peak emission wavelength different from the first and the second peak emission wavelengths. Each third light emitting device may contain a third growth template including a third nanostructure, which may have a nanopyramid shape. Each third nanostructure may comprise a third nanowire core which protrudes through third aperture in a growth mask in the third area, each third aperture may have a substantially equal width or diameter to each first and second aperture, and each third aperture may be spaced farther apart from adjacent third apertures than each first and second apertures are spaced apart from adjacent respective first and second apertures. Each third growth template may have a substantially equal or smaller growth area contacting a third active region than a growth area of each first and second growth template contacting the respective first and second active regions, and the third peak emission wavelength may be longer than the first and the second peak emission wavelengths.

In another embodiment, each first aperture may have substantially larger width or diameter than each second aperture, each first aperture may be spaced substantially equal or farther apart from adjacent first apertures than each second aperture is spaced apart from adjacent second apertures, and each first growth template may have substantially the same or a smaller growth area contacting the first active region than a growth area of each second growth template contacting the second active region.

The first and the second light emitting devices may comprise light emitting diodes, and each first and second junction forming the respective light emitting devices may be selected from a semiconductor shell, a continuous semiconductor layer which contacts plural growth templates, or a continuous semiconductor layer with interstitial voids which contacts plural growth templates.

Another embodiment provides a method of making a light emitting device that includes providing a growth substrate including a growth mask having a plurality of first apertures in a first area and a plurality of second apertures in a second area; and selectively growing a plurality of first nanostructures through the first apertures and a plurality of second nanostructures through the second apertures in a same nanostructure growth step, where the first and the second nanostructures include an inner portion or an entirety of respective first and second growth templates. The method also includes growing first and second active regions on respective first and second growth templates in the same active region growth step, and growing first and second junction forming elements on respective first and second active regions in a same junction forming element growth step to form respective first and second light emitting devices. Each first growth template differs from each second growth template such that each second light emitting device has a second peak emission wavelength different from a first peak emission wavelength of each first light emitting device.

Another embodiment provides an intermediate semiconductor structure, including a substrate, a plurality of first growth templates including a first semiconductor nanostructure located over a first area of the substrate, and a plurality of second growth templates including a second semiconductor nanostructure located over a second area of the substrate. Each first growth template differs from each second growth template by at least one of: (a) a growth area for a respective active region, (b) a ratio of exposed growth planes, or (c) a spacing from adjacent growth templates.

Another embodiment provides method of making a semiconductor device, including providing the above described intermediate semiconductor structure, and growing first and second indium gallium nitride semiconductor active regions on respective first and second growth templates in a same active region growth step. Each first active region contains a different amount of indium from each second active region due to the difference between the first and the second growth templates.

Another embodiment provides a method of growing a III-V semiconductor nanowire, including growing the III-V nanowire over a substrate by MOCVD in a group V limited growth regime.

BRIEF DESCRIPTION OF THE DRAWINGS

FIGS. 2A, 2C, 3A, 4A, 5A, 6A and 6A show top views of a semiconductor device of alternative embodiments of the disclosure. FIGS. 2B, 2D, 3B, 4B, 5B, 6B and 8B show side cross sectional views along line A-A of respective FIGS. 2A, 2C, 4A, 5A, 6A and 8A.

FIG. 17 is a cross-section schematic depiction of several subpixels in a two-channel cathode image chip. Light emitted by the subpixels may be extracted through the substrate. For simplicity, each subpixel is illustrated as including a single nanowire.

DETAILED DESCRIPTION

Figure 1B:
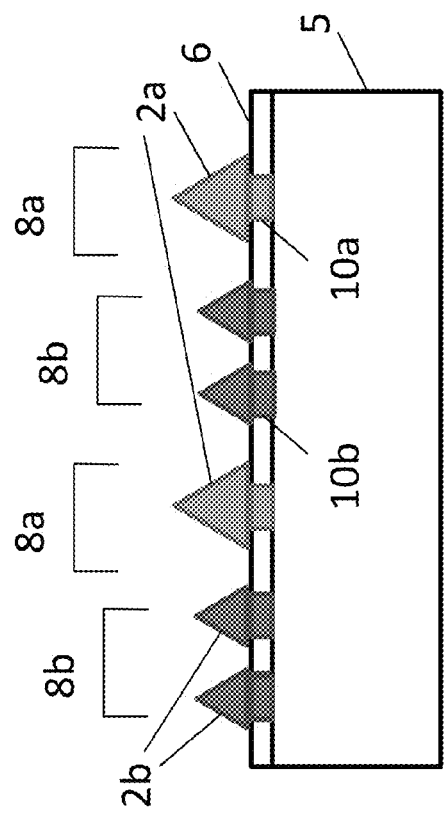
FIGS. 1A and 1B show the top view and a side cross sectional view along line A-A, respectively, of a semiconductor device of an embodiment of the disclosure.

As discussed above, the present disclosure is directed to arrays of light emitting diodes (LEDs), arrays capable of emitting light of at least two different wavelengths, methods of fabricating such arrays, and an image chip. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

Herein "p-plane" means "pyramid plane" and represents a $\{1\bar{1}01\}$ plane in the III-nitride system, "c-plane" represents a $\{0001\}$ plane, and "m-plane" represents a $\{10\bar{1}0\}$ plane. Growth rate means layer growth rate when not otherwise specified. Usually, in selective growth, volume growth rate is constant irrespective of geometry. One aspect of the disclosure described below provides the ability to locally set a grown volume of semiconductor material.

Herein "kinetically limited growth regime" means a growth regime where growth rate predominantly is hindered by an energetic barrier (low temperature, cracking of source material, release of surface bonds etc.) to reach thermodynamic equilibrium. "Mass flow limited growth regime" means a growth regime where precipitation at the growth area is predominantly unhindered but growth rate is limited by concentration of source material at the growth area. "Group III limited growth regime" means a growth regime that is mass flow limited with regards to the column III element or elements while "group V limited growth regime" means a growth regime that is mass flow limited with regards to the column V element or elements.

A growth system is usually limited by a subset of these parameters in combination; i.e., a growth rate is often limited by source concentration even if a severe kinetic reaction barrier exists in the system. The relative weight of V to III limited growth rate is most easily adjusted by altering the total V/III-ratio. The relative weight of kinetical to mass flow limited growth, rate is more complex, as it depends on the origin of the kinetical barrier. Usual parameters that change this are temperature, total pressure, total flow, carrier gas and V/III-ratio. It is also important to realize that in V/III growth where 50% of each element group is needed to proceed with precipitation, one group element can be kinetically limited while the other group elements are mass flow limited such that only one of the groups is causing the growth rate limitation. In traditional V/III growth, in MOVPE and similar growth methods, high quality material is often grown with a high overflow of V material, for example, in GaN using V/III source gas mass flow ratio of at least 1,000, such as 1,000 to 10,000. Under these conditions, the growth rate is group III limited while the group V concentration is high to keep a saturated overflow of V material to the growth surface. In contrast, in the group V limited growth mode, the V/III ratio is preferably less than 1,000, such as 0.001 to 100, for example less than 1, such as 0.001 to 0.1.

To determine the type of growth rate limitation at a certain growth condition is relatively straightforward and is done by changing the condition parameters and recording the change in growth rate (e.g., thickness measurements). Energy heights of kinetic barriers can be deduced by temperature dependent growth rate measurements.

Note that the kinetic barrier of cracking efficiency of $NH_3$ due to GaN is well established but is an additional parameter, not discussed in the theoretical part below. The theoretical part treats flow rate and growth areas as purely geometrical and volume impact factors on growth rate.

Simultaneous growth of several color LEDs in one step would be of high commercial interest, not only for RGB (Red Green Blue), YB (Yellow Blue) or YGB (Yellow Green Blue) combinations for white rendition of light (i.e., white light emitting LED based on combination of RGB, YB or YGB peak wavelength emission) but also high efficiency GB (Green Blue) since viable green phosphors and green LEDs based on other material systems have been hard to realize. In view of the shortcomings of prior art devices, the present inventors have devised a selectively grown structure that can be used to form optoelectronic devices, e.g., LED arrays. As used herein, the term simultaneous growth in one step means that the corresponding layers or structures of different color emitting LEDs are grown in one step. Thus, for example, the nanostructure cores of different color emitting LEDs may be grown in the same first step, the QW active regions of different color emitting LEDs may be grown in the same second step and the junction forming elements or shells of different color emitting LEDs may be grown in the same third step.

Preferably, the arrays of semiconductor LED elements include nanostructured (e.g., nanowire or nanopyramid) cores, herein referred to as templates, surrounded by shells comprising active region and volume element shells. Such nanostructure LEDs may be considered as "point sources" of light or UV radiation, which are different from the prior art LED structures comprising elongated stripes or planar bulk semiconductor layers. The templates may comprise a single gown layer, such as a nanowire core, but also be formed from multiple layers as will be described below.

In some of the following embodiments, the group V limited conditions/regime are exemplified in a nanowire core growth step through an opening in a mask. However, any other suitable growth regime where the group V limitation is achieved with sufficiently good quality material as product, can be utilized, such as VLS growth or other selective growth methods. Thus, the selective nanowire growth as the group V limited growth step is therefore used to merely exemplify rather than limit the disclosure.

In one embodiment, the arrays include at least two semiconductor structures, such as nanostructures, having different properties in terms of geometry, e.g., length and/or width of individual elements, and/or the spacing between different elements. Also, the area of the quantum well and the relative facet distribution on the template which the QW are grown on may differ. Conveniently, in examples below, particular, elements with different geometrical properties are grouped together according to selected patterns in order to provide the desired effect of multi-color light (i.e., multiple peak wavelength) emission. Elements or groups of elements, with different optical and geometrical properties may also be fabricated in intermixed patterns, i.e., in order to blend colors at chip level or to facilitate other optical interactions.

In another embodiment, a method of making the multi-color LED array includes forming a growth mask containing a pattern of growth apertures having different size (area and/or diameter) and/or different spacing between apertures in different portions of the mask in order to provide the different geometries of the semiconductor structures in the array. The method utilizes in situ growth of multiple groups of semiconductor structures (e.g., nanowire cores) without the need for other process steps outside of the growth chamber, such as etching and ion implantation, during the fabrication of the semiconductor structures. In some embodiments, the method comprises a plural step growth mode, including at least one nanowire core growth step and one or more steps of growing radial layers around the cores to form a template.

An advantage of a method of making a multi-color LED array according to various embodiments may include the opportunity to use small footprint aperture sizes to fabricate larger semiconductor structures, forming devices distinguished by appreciably smaller cross sectional foot print area compared to the semiconductor structure total base area, the small foot print giving low crystal defect or dislocation density as compared to the substrate. Another advantage of a method of making a multi-color LED array according to various embodiments may include that a variety of structure shapes and relative facet area ratios ma be fabricated at the same time (i.e., in the same growth step). By introducing a growth regime where growth area does not change until the transition to radial layer growth, height of the structures, and therefore resulting shape of structures may be made independent of one of the aperture size and/or spacing as will be described below.

A method according to various embodiments may also include utilizing a nanowire growth regime where the resulting lengths of the nanowires maybe controlled to be independent of or dependent on mask geometry in a continuous manner to optimize different wavelength emission by different LEDs in the array.

Various embodiments may enable the fabrication of groups of semiconductor structures (e.g., nanostructure cores) with similar height but different shape (e.g., different thickness nanowires and/or nanowires and nanopyramids). Various embodiments may also enable fabrication of groups of semiconductor structures with different height but similar shape.

Various embodiments may provide the ability to fabricate groups of semiconductor structures comprising a layer having approximately the same shape but different total area. Embodiments may further enable fabrication of groups of semiconductor structures comprising a layer with approximately the same area but different shape.

Various embodiments may provide the ability to fabricate groups of semiconductor structures comprising a layer with approximately the same area but different relative facet area ratio between groups. Embodiments may further enable fabrication of groups of semiconductor structures with similar spacing, comprising a layer with different relative facet area ratio between groups.

In a general aspect, various embodiments of the present disclosure relate to selectively grown optoelectronic structures or elements, provided on a substrate, where groups of a plurality of individual selectively grown structures may have different properties in terms of size, geometry, spacing and distribution over the substrate to provide for different color light emission from the different groups. In terms of geometry, the individual elements may have the same lengths and/or heights or have different lengths and/or heights, they may have different or the same effective diameter (or width), they may exhibit different facets, and the overall geometry may be varied based on spacing between or size of the apertures of the mask used for the growth of individual elements and between groups of elements.

Thus, embodiments of the disclosure may include a substrate and at least two growth elements (e.g., nanostructure cores) protruding from the substrate. The cores may protrude from the substrate through apertures in a growth mask over the substrate. The nanostructure cores may have a lateral extension (i.e., diameter or width) of 3 µm or less in any lateral direction, for example 100 nm to 1 micron, and a height between 50 nm and 10 µm such as 0.1 to 5 microns. Examples of nanostructure cores include nanowire (i.e., nanopillar) and nanopyramid cores that are described below. As noted above, the nanostructure core itself or a nanostructure core with one or more shell layers forms the growth template. Furthermore, if desired, the growth substrate may be removed after the growth of the cores over the substrate, such that the finished device is a freestanding device or is mounted to a different handle substrate.

For the InGaN quantum well ("QW") active region, the higher growth rate of the InGaN semiconductor layer (e.g., QW shell on a semiconductor nanostructure core) results in higher indium incorporation into the quantum well. A higher indium incorporation results in a narrower band gap of the QW semiconductor material and thus in a longer emitted peak wavelength by the LED (i.e., a red shift in the emitted color).

In a first embodiment, the higher QW growth rate occurs on first growth areas (e.g., on nanowire or nanopyramid templates) that are spaced farther apart from each other by non-growth areas (e.g., masked substrate areas) than on second growth areas (e.g., templates) which are spaced closer to each other. Thus, in the first embodiment, a first growth area contains semiconductor templates which are spaced apart from adjacent templates by a larger distance than the adjacent templates in a second growth area. This difference in spacing results in higher indium incorporation in the active regions (e.g., QW(s)) formed on the templates in the first growth area than on the templates in the second growth area, even when the active regions are formed in the same growth step at the same time in both first and second groups of growth areas. The LEDs formed in the first growth area have a longer peak emission wavelength than LEDs formed in the second growth area.

The wider spaced templates in the first growth area may have a larger height and thus a larger exposed surface area than the narrower spaced cores in the second area in a typical Group III limited (e.g., mass flow limited) MOCVD growth regime. The larger height and surface area of the cores in the first area means that less indium may be incorporated into the active region formed on the templates in the first area than on cores in the second area. Thus, the difference in height and area of the cores works against the difference in spacing between the templates in differentiating the emitted wavelength from the active region.

The present inventors have discovered that introducing a Group V material limited growth regime, in contrast to the traditional group III limited regime used in III-V growth, may enable the difference in height of the templates in the first and the second growth areas to be made smaller or even eliminated (i.e., such that the height of the templates in the first and second growth areas may be substantially equal). This also means that the total growth area for subsequent layers will be larger in the second growth areas. Therefore, in embodiments, the templates of the first embodiment are formed through apertures in the growth mask by at least one growth step, such as a at least one metal organic chemical vapor deposition (MOCVD) growth step operating in the Group V material limited growth regime. In this regime, the growth is Group V element (e.g., nitrogen) limited because a relatively low Group V to Group III source gas ratio (e.g., ammonia:TEG or TMG ratio below 1,000, such as 0.001 to 100, for GaN cores) is used. In should be noted that for templates that include both a nanostructure (e.g., nanowire) core and one or more shells, the nanostructure core may be grown in the group V limited mode, while the shell(s) may be grown in either the group III or group V limited mode, as will be illustrated below. Thus, the template (e.g., nanowire core or nanowire core plus at least one shell) height and area does not work against the template spacing difference in ensuring a different emission wavelength for LEDs in the first and the second areas. The more or less instantaneous gas phase diffusion of ammonia (as compared to TEG or TMG) makes it a source that does not decrease in gas phase concentration locally when the growth is group V (e.g., ammonia) limited, as will be discussed in more detail below.

In a second embodiment, more indium is incorporated into the active regions (e.g., QWs) grown on p-planes of the templates than the active regions grown on m-planes of the templates. Thus, in the second embodiment, the templates in a first growth area contains more exposed p-plane facet area (and less m-plane facet area) than the templates in a second area. In other words, at least two of the templates have different areal facet ratio or shape. The areal facet ratio is the relative area of at least two such facets, such as a p-plane facet and an m-plane facet.

For templates that are formed by growth through apertures in the mask, the mask in the first growth area may contain larger apertures than the mask in the second growth area. This may result in nanopyramid templates with larger area of exposed p-planes to be formed in the first growth area and nanowire templates with smaller area of exposed p-planes (e.g., p-planes exposed only at the tip of the nanowire) and larger exposed m-planes (e.g., exposed on the sidewalls of the hexagonal cross-section nanowire templates) to be formed in the second growth area. This difference in amount of exposed p-plane area on the templates results in higher indium incorporation in the active regions (e.g., QW(s)) formed on the templates in the first area than on the growth areas in the second area, even when the active regions are formed in the same growth step at the same time in both first and second growth areas. Therefore, the LEDs formed in the first growth area will have a longer peak emission wavelength than LEDs formed in the second growth area.

The active region growth rate on larger growth areas is slower than growth rate on smaller growth areas. Thus, less indium is incorporated into the active regions formed on larger area templates than on smaller area templates (unless spacing is changed to the extent to give a higher impact on the total local growth area than the relative difference in template size). Thus, if the p-plane facet dominant templates (e.g., nanopyramid templates) have a smaller area or height than the m-plane facet dominant templates (e.g., nanowire templates), then less indium would be incorporated into the m-plane facet dominant templates, which enhances the positive effect of the difference in the exposed p-plane area between the nanopyramid and nanowire templates (i.e., total area difference works synergistically with the difference in exposed p-plane area).

The present inventors have also discovered that increasing local growth area, such as by increasing the density of apertures, may increase the height of the densely grown cores further as compared to cores further spaced apart when growing in a group V limited regime. Without wishing to be bound by theory, this effect may be explained by the group V-source gas, especially and here exemplified by $NH_3$, having a severe kinetic bottleneck in cracking to elemental nitrogen. Approximately 15% $NH_3$ is cracked at 950° C. catalyzed by a GaN surface. A rough estimation of gas phase cracking in the absence of GaN or exposed to a dielectric surface, such as a silicon nitride mask, is 1% to 3% at typical GaN growth temperatures, such as between 800 and 1000° C. The enlarged surface area of GaN templates formed by a denser spacing of cores can in this way enhance V-limited growth rate and the height of the closer spaced templates well above the height of the templates spaced further apart from each other. This ensures that the total area of the closer spaced templates in the second growth area are larger than those of the farther spaced templates in the first growth area. Thus, in embodiments it may be desirable to use a V-group limited growth regime to ensure that the templates in the second growth area have a larger area or height than the templates in the first growth area, such that more indium may be incorporated into the active regions grown in the second first growth area. Therefore, in embodiments, the III-nitride nanowire or nanopyramid templates of the second embodiment may be formed through apertures in the growth mask by a metal organic chemical vapor deposition (MOCVD) method operating in the group V limited regime in combination with sufficient density of apertures to produce an increase in GaN caused catalytic cracking of the $NH_3$ group V source gas. This may result in taller and larger area templates in the second growth area than in the first growth area.

A third embodiment may be a combination of the first and the second embodiments, such that the apertures in the growth mask may be larger in the first growth area than in the second growth area, and the apertures may be farther spaced apart in the first growth area than in the second growth area. Thus, the aperture spacing and size may synergistically increase the difference in peak emitted wavelength between LEDs formed in the first and the second growth areas.

In this embodiment, the heights of the templates in first growth area may be larger than the height of the templates in the second growth area. This effect may be enhanced by the increase of the GaN surface area in the first growth area, utilizing the kinetic barrier of $NH_3$ cracking as described above. The nanowire core growth step comprised in the template growth in the third embodiment may then preferably be conducted in the group V material limited growth regime, unless the difference in aperture spacing is much greater than the difference in aperture size between the first and the second areas. In this case, a group III limited growth regime may preferably be used. It should be noted that the formation of the active region (e.g., QW) and shell growth may be conducted in the Group III limited growth regime in all three embodiments irrespective of the regime used to grow the templates.

Thus, in various embodiments, the mask used for growing the templates for the LEDs or other optoelectronic devices may contain apertures of different spacing, and/or size in different growth areas to promote growth of different shape templates in each growth area, and subsequently the growth of active regions with different composition (e.g., different indium content) on said templates.

The term selective growth refers to epitaxial growth on at least one surface where growth on other surfaces is low or even negligible. Selective nanostructure template growth by MOCVD preferably uses a mask with openings over an epitaxial substrate where growth is confined to the apertures with no growth on the mask. However, other forms of nanostructure (e.g., nanowire) growth, such as VLS, or particle enhanced growth, are also selective in the way that one direction or facet of the crystal is growing appreciably faster than other facets. Nanowire growth could be called surface selective growth, but the term surface selective growth has also been used for any kind of structure where one surface or facet is growing faster than other surfaces. Thus, the present disclosure is not limited to templates growth through mask apertures and includes various other types of nanostructure templates. Furthermore, the growth method is not limited to MOCVD and includes other methods, such as CBE, MBE, LP-MOVPE, etc. Any method where effective and distinctive selective growth regimes can be realized is viable.

Preferably, the optoelectronic device is an LED array which has templates of different shape, size and/or pitch. Preferably each template is a semiconductor template of a first conductivity type (e.g., an n-type GaN nanowire or nanopyramid template). The template, the active region (e.g., InGaN quantum well(s)) and the shell of a second conductivity type (e.g., ca p-type GaN shell) form a p-i-n junction. The active region emits light (e.g., visible light or UV radiation) when a voltage is applied over the junction. The light emitted from at least two LEDs in the array has different wavelengths. The different wavelengths of the emitted light are achieved by at least two templates exhibiting different area.

Various non-limiting embodiments of the above described mask aperture and nanostructure template arrangements will be described with reference to FIGS. 1 to 6. FIGS. 1A, 2A, 2C, 3A, 4A, 5A and 6A show the top view of the nanostructure templates in the mask apertures, while FIGS. 1B, 2B, 2D, 3B, 4B, 5B and 6B show the respective side cross sectional views of the devices in respective FIGS. 1A, 2A, 2C, 3A, 4A, 5A and 6A along line A-A in each figure. Three different variables are varied in a number of combinations shown in these figures, namely 1) the spacing between apertures and groups of apertures; 2) the mask aperture size; and 3) whether one of the growth steps comprising the template growth (e.g., template nanostructure core growth) is group V or group III limited.

Figure 1A:
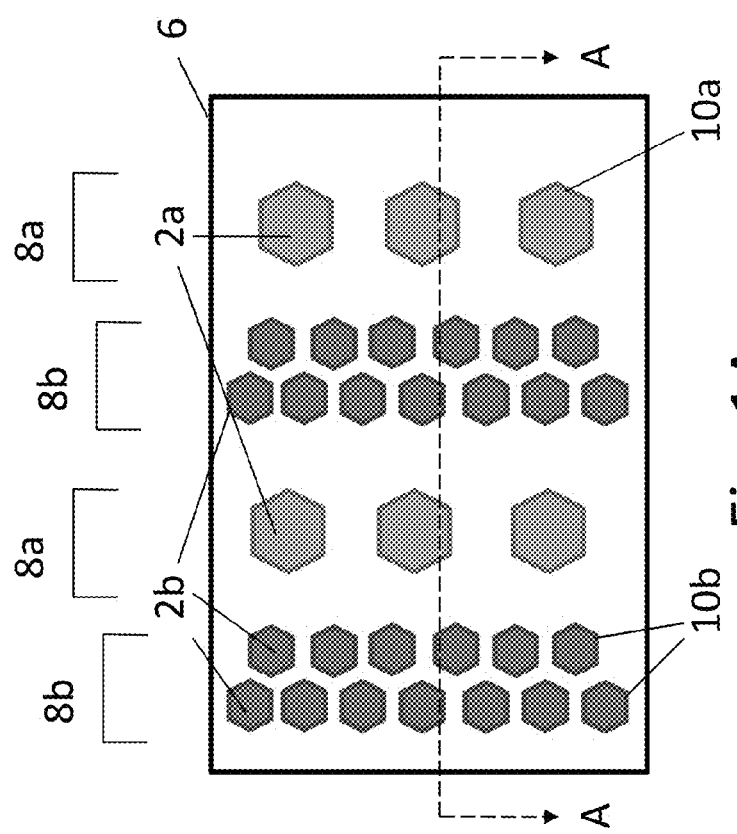

FIGS. 1A and 1B illustrate the first embodiment where differently spaced templates are providing for LEDs emitting two different wavelengths. In these figures, a growth mask 6 (e.g., a silicon nitride layer or another insulating material layer) is grown over a substrate 5 (e.g., silicon, GaN, sapphire, etc.). The substrate 5 may contain a semiconductor buffer layer (e.g., GaN, AlGaN, etc. not shown for clarity) under the mask 6. FIG. 1A is a schematic top view of an LED chip with two groups of nanostructure templates 2A, 2B in respective first 8A and second 8B growth areas, and FIG. 1B is a side cross section view with a cross-section through the elements along the line A-A in FIG. 1A. As shown in the figures, there may be plural growth areas 8A, 8B on the substrate 5 (e.g., alternating first and second growth areas).

In FIGS. 1A and 1B, the geometry of the templates 2A, 2B is controlled by mask 6 aperture 10A and 10B spacing. In this embodiment, the apertures 10A, 10B have the same size (e.g., same width, length and/or diameter), while spacing between apertures are different in growth areas 8A and 8B. By setting nanowire core growth to be group III-limited by a relatively large group V:group III flow ratio, the height of the templates in growth areas 8A and can be made larger than the template heights in growth areas 8B. As shown in these figures, nanopyramid type templates 2A, 2B are selectively grown in the respective apertures 10A, 10B in respective growth areas 8A, 8B, due to group III limited conditions of radial (pyramidal) shell growth steps after the nanowire core growth. Other template types (e.g., nanowire templates) may be grown if the size of the apertures 10A and 10B is reduced. No group V limited growth step is warranted in this embodiment.

The first apertures 10A in the first growth area 8A are more widely spaced apart from adjacent apertures than the second apertures 10B in the second growth area 8B. Therefore, the first nanopyramid templates 2A protruding from the first apertures 10A in the first growth area 8A are more widely spaced apart from adjacent templates than the nanopyramid templates 2B protruding from the second apertures 10B in the second growth area 8B.

Due to the different spacing between the templates, the incorporation of In into the active region (e.g., QW) that may subsequently be formed on the templates 2A, 2B in the same active region growth step will be different. Specifically, there will be more In incorporation into the active regions on the first growth templates 2A than In incorporation into the active regions on the second growth templates 2B during the active region growth step. Thus, the band gap will be wider in the active regions grown on the first growth templates 2A than on the second growth templates 2B. In particular, the less densely arranged LEDs formed on the first growth templates 2A will emit longer wavelength light (e.g., red, yellow or green light) while the more densely arranged LEDs on the second growth templates 2B will emit shorter wavelength light (e.g., blue light).

It should be noted that this is conditioned by that the surface area of the templates 2A, being higher than the 2B templates has not increased as much as the interstitial mask area has increased with spacing difference of 8A and 8B. The first nanopyramid templates 2A have a larger height and thus a larger exposed surface area than the second nanopyramid templates 2B due to the column III limited growth regime. The larger height and surface area of templates 2A means that less indium will be incorporated into the active region formed on templates 2A than on templates 2B. Thus, the difference in height and area of the templates works against the difference in spacing between the templates in differentiating the emitted wavelength from the active region.

Therefore, the inventors have discovered that it may be preferable to grow the templates in the Group V limited growth regime when the templates have a different spacing in different growth areas (but where the aperture size in the same in both growth areas). As shown in FIGS. 2A and 2B, when the group V limited growth regime is used with the same size apertures 10A, 10B, the templates 2A protruding through the wider spaced apart openings 10A in the growth mask 6 in area 8A may have a nanopyramid shape, while the templates 102B protruding through the narrower spaced apart openings 10B in the growth mask 6 in area 8B may have a nanowire (e.g., nanopillar) shape.

The nanopyramid templates 2A and the nanowire templates 102B have about the same height and a similar exposed surface area when they are grown in the group V limited growth mode. This means that a small difference (if any) in exposed surface area of the templates 2A and 102B will not have a large negative impact on the difference in amount of indium incorporation into the active regions on the templates. Furthermore, the nanowire templates 102B have m-plane "in" facets exposed along the majority of their sidewalls and smaller p-plane "p" facets exposed near their tips. This means that the active regions formed on the nanopyramid templates 2A with larger area of exposed p-plane facets than the nanowire templates 102B will synergistically have more indium incorporation than the active regions formed on the in-plane facets of the nanowire templates 102B. Therefore, the active regions formed on nanopyramid templates in areas 8A will emit an even longer wavelength than the active regions formed in nanowire templates 102B in areas 8B. Thus, the Group V limited growth regime enhances the difference in emitted wavelength between the LEDs in areas 8A and 8B.

FIGS. 2C and 2D illustrate an alternative embodiment where the nanowire templates 102B have a greater height and greater exposed surface area than the nanopyramid templates 2A when these templates are grown in the group V limited growth mode in combination with a sufficiently high density of apertures in area 8B and a sufficiently high growth temperature to warrant an increase in the GaN mediated catalytic cracking of the group V source gas (e.g., $NH_3$) in the second growth area 8B.

As discussed above, approximately 15% of the group V source gas, $NH_3$, is cracked at 950° C. due to catalization of the cracking by the GaN template surface. A rough estimation of $NH_3$ gas phase cracking in the absence of the GaN templates or when the gas is exposed to a dielectric surface, such as a silicon nitride mask 6 surface, is 1% to 3% at typical GaN growth temperatures between 800 and 1000° C. The enlarged surface area of GaN exposed to the ammonia gas in areas 8B resulting from a denser spacing of the GaN cores in areas 8B than in areas 8A can enhance the group V limited growth rate and the height of the closer spaced nanowire shaped templates 102B in areas 9B well above the height of the pyramid shaped templates 2A in areas 8A which are spaced further apart from each other. This ensures that the total area of the templates of the closer spaced templates 102B in the growth areas 8B are larger than those of the farther spaced templates 2A in the growth areas 8A. Thus, it may be desirable to use V-group limited growth regime at a sufficiently high temperature (e.g., at least 800° C. such as 800 to 1000° C., for example 950 to 1000° C.) to ensure that the templates 102B in the growth areas 8B have a larger area or height than the templates 2A in the growth areas 8A because even more indium may be incorporated into the active regions grown in areas 8A relative to the indium incorporated into the active regions grown in areas 8B. In other words, since the templates 2A have a smaller exposed area, are spaced farther apart and have more exposed p-plane area, more indium is incorporated into the active regions grown on templates 2A in areas 8A than into active regions grown on templates 102B in areas 102B.

Figures 3A, 3B:
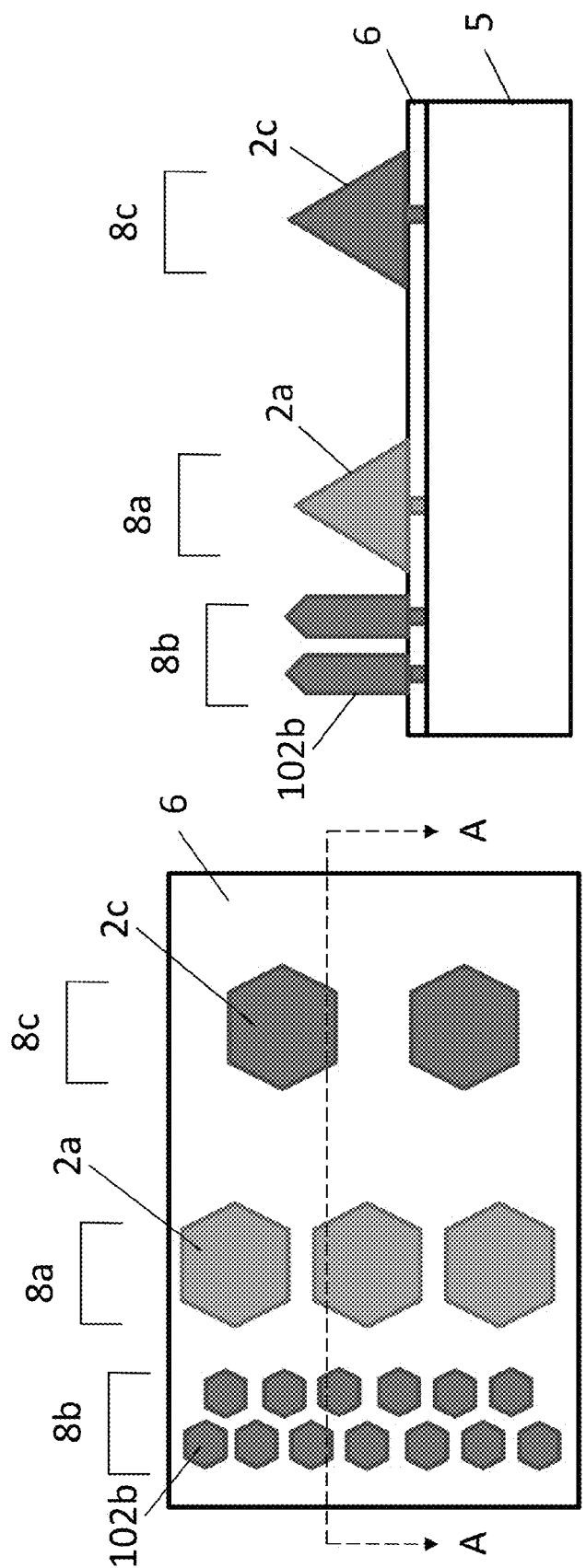

While only two repeating growth areas 8A, 8B are shown in FIGS. 1 and 2, more than two growth areas may be formed on the same substrate 5. For example, as shown in FIGS. 3A and 3B, three different growth areas 8A, 8B and 8C may be formed on the substrate 5. In this example, the size of the apertures 10A, 10B and 10C in the mask 6 is the same in all three areas 8A, 8B and 8C. However, the apertures 10C in area 8C are spaced apart wider than apertures 10A in area 8A, and the apertures 10A in area 8A are spaced apart wider (larger pitch) than apertures 10B in area 8B. In the non-limiting embodiment, nanowire templates 102B are formed in area 8B and nanopyramid templates 2A and 2C are formed in areas 8A and 8C, respectively. Thus, the active regions of LEDs formed on templates 102B in area 8B will have the shortest emitted wavelength (e.g., blue), the active regions of LEDs formed on templates 2A in area 8A will have the intermediate emitted wavelength (e.g., green) and the active regions of LEDs formed on templates 2C in area 8C will have the longest emitted wavelength (e.g., red). Of course more than three growth areas may be included (e.g., five to seven areas) to form active regions of LEDs which will emit red, orange, yellow, green and blue wavelength light.

Figures 4A, 4B:
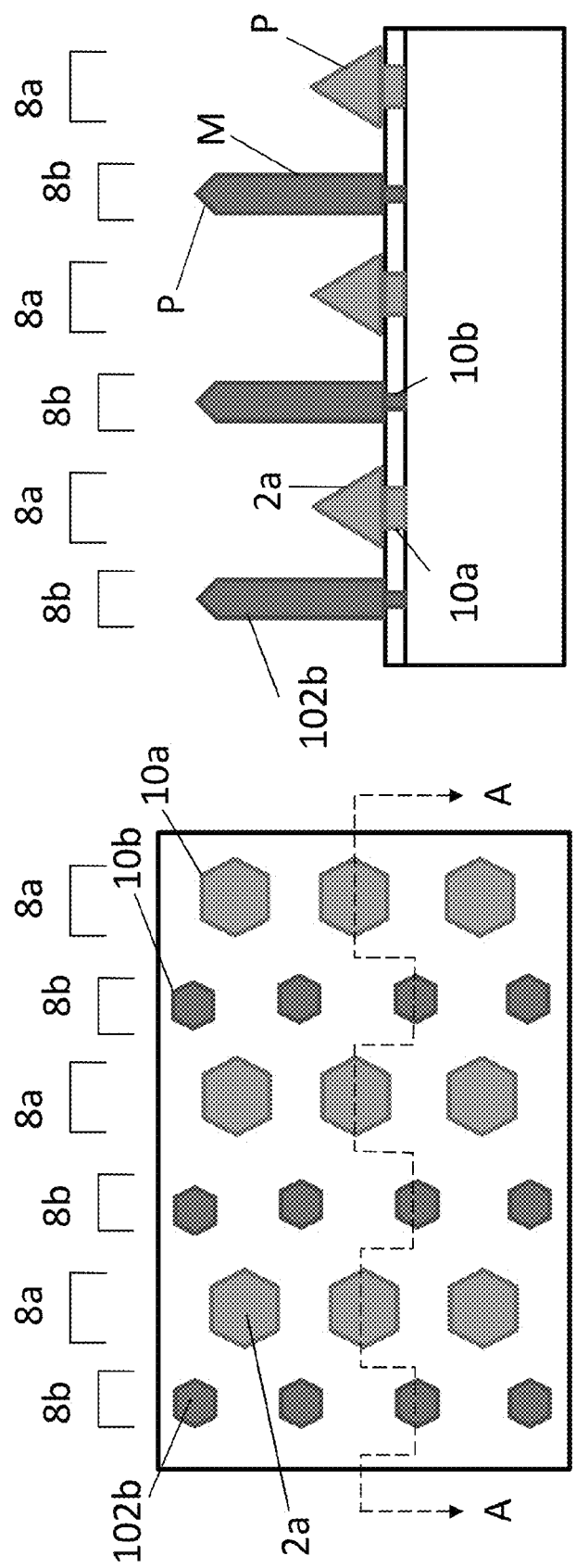

In an alternative embodiment shown FIGS. 4A and 4B, instead of varying the spacing between adjacent apertures in growth areas 8A and 8B, the mask aperture 10A, 10B area or size may be varied between growth areas 8A and 8B. The spacing between adjacent apertures is the same in both growth areas 8A and 8B. Apertures 10A in area 8A are larger than apertures 10B in area 8B.

In this embodiment, the growth regime is preferably set to be group III limited by using a relatively small group III:V flow ratio. Thereby, since the growth initially is set for growth in the vertical direction, due to the growth area being larger for templates protruding from larger apertures 10A in area 8A than for templates protruding from smaller apertures 10B in area 8B, the templates in area 8A may be wider and shorter than templates in area 8B because for a given time equal volumes of material will deposit in the mask apertures 10A, 10B. Continuing or switching to template growth in radial direction may yield the two different template types. Nanowire or nanopillar templates 102B may be formed in smaller apertures 10B in area 8B, while nanopyramid templates 2A may be formed in larger apertures 10A in area 8A. The nanopyramid templates 2A have larger amount of p-plane side facets "p" exposed to active region growth than the nanowire templates 102B. The nanowire templates 102B have more m-plane side faces "m" exposed than the nanopyramid templates 2A. Since the p-plane side facets result in more indium incorporation into the active regions grown on these facets than m-plane side facets, the active regions grown on nanopyramid templates 2A in area 8A will emit a longer wavelength light than the active regions grown on the nanowire templates 102B in area 8B during the same growth step.

Furthermore, in the group III limited growth regime, the nanowire templates 102B may be taller and have a larger exposed surface area than the nanopyramid templates 2A. This means that more indium will be incorporated into the active regions formed on nanopyramid templates 2A than on nanowire templates 102B. This synergistic effect farther increases the difference in emitted wavelength between the active regions formed in area 8A on templates 2A (e.g., even shorter wavelength) and the active regions formed in area 8B on templates 102B (e.g., even longer wavelength). As discussed above, more than two growth areas with different aperture size (e.g., 3 to 7 areas) may be used.

In the third embodiment illustrated in FIGS. 5A and 5B, both the aperture spacing (according to the first embodiment) and the aperture size (according to the second embodiment) are varied between the growth areas. Thus, the apertures 10A in growth area 8A are both spaced apart wider from adjacent apertures and have a larger size than the apertures 10B in growth area 8B.

In FIGS. 5A and 5B, the templates may be grown in either the group III limited growth regime or in the group V limited growth regime if spacing of apertures in area 8B is close enough to increase GaN surface area during the nanowire growth step (in order to improve kinetical efficiency of NH$_3$ cracking). Both these regimes result in shorter, farther spaced apart nanopyramid templates 2A protruding through the apertures 10A in area 8A and taller, closer spaced apart nanowire templates 102B protruding through the apertures 10B in area 8B. As provided in the prior embodiments, the active regions of the LEDs grown on templates 2A in area 8A will contain more indium and will emit light of a longer wavelength than the active regions of the LEDs grown on templates 102B in area 8B.

In FIGS. 6A and 6B, the apertures 10A, 10B have the same size and spacing as in FIGS. 5A and 5B. However, the templates are grown in the group V limited growth regime but where NH$_2$ cracking is not appreciably catalyzed by the GaN surface. This also results in farther spaced apart nanopyramid templates 2A protruding through the apertures 10A in area 8A and closer spaced apart nanowire templates 102B protruding through the apertures 10B in area 8B. However, the templates 2A and 102B have about the same height. As provided in the prior embodiments, the active regions of the LEDs grown on templates 2A in area 8A will contain more indium and will emit light of a longer wavelength than the active regions of the LEDs grown on templates 102B in area 8B. However, the difference in indium incorporation and emitted wavelength of the active regions will generally be smaller than that for devices containing the different height templates in FIGS. 5A and 5B. Therefore, the III limited regime may be preferred for the third embodiment unless the difference in aperture spacing is much greater than the difference in aperture size. The GaN surface is a changing variable (growth time dependent), both for setting the template to mask ratio in radial growth and as a catalytic surface. The longer the growth is continued in the nanowire growth mode, the larger the difference becomes for catalytic effect (i.e., the longer the nanowire, the greater the available ammonia cracking area because both the top and sidewalls of the nanowire help crack the ammonia).

Any suitable MOCVD process conditions may be used to form the templates 2, 102 shown in FIGS. 1A-6B. In one example, the MOCVD reactor pressure is 5-100 kPa (50-1000 mbar) and the reactor temperature is 500-1200° C., preferably 900-1200° C. The Group III source gas may be TMG (trimethylgallitum) or TEG (trietbylgallium) having a flow rate of 0.12 and 1.2 μmol/min or 0.5-10 sccm/min. The Group V source gas may be ammonia having a flow rate of 0.2 to 10 sccm/min such as 0.2 to 3 sccm/min.

The growth process may be made III group limited or group V limited by changing the Group III to Group V source gas flow ratio. Furthermore the group V limited regime may be manipulated to be more or less kinetically limited locally by the total local GaN surface area. Providing an increasing flow of Group III source gas where growth rate is not increasing with increasing Group III source gas flow will result in a group V limited growth (i.e., a high III:V ratio). Providing a lower flow of Group III source gas where growth rate is increasing with increasing Group III source gas flow will result in group V limited growth (i.e., a low III:V ratio).

Figure 7:
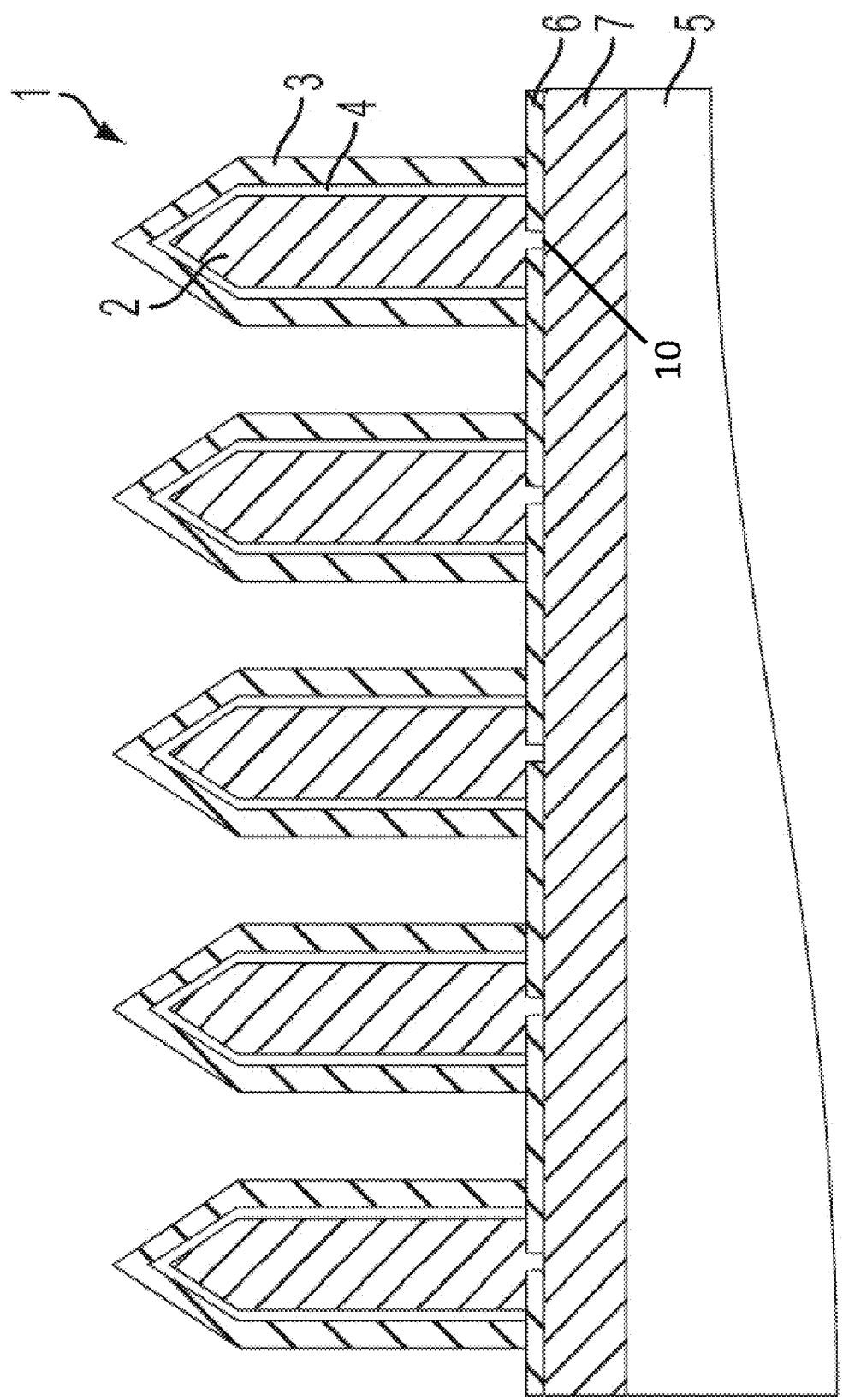
FIG. 7 shows aside cross sectional view of a semiconductor device according to various embodiments of the disclosure.
Figure 9A:
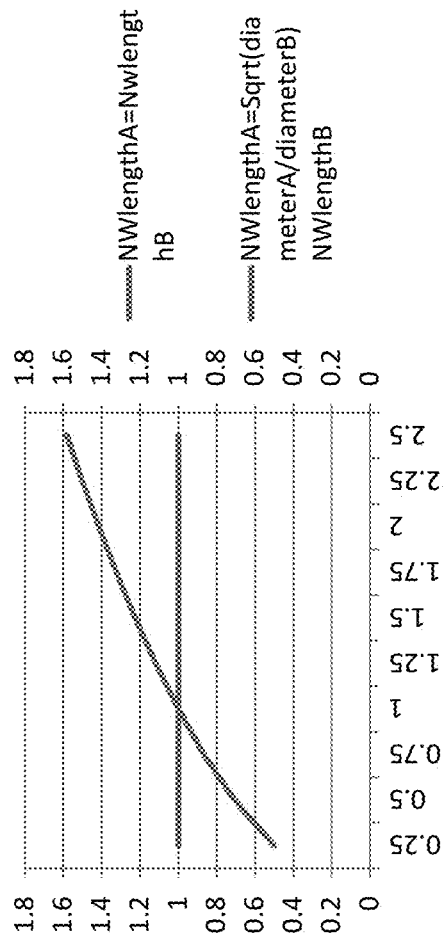
FIGS. 9A and 9B are theoretical plots of nanowire length versus mask aperture spacing and mask aperture diameter, respectively.
Figure 9B:
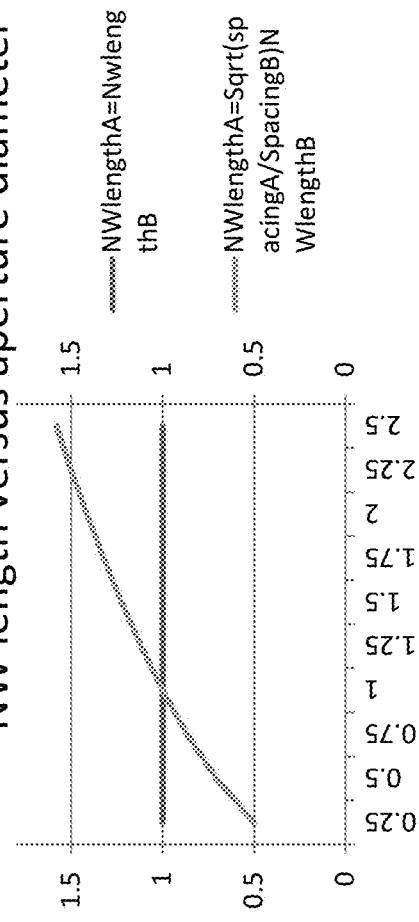

As shown in FIG. 7, each completed LED 1 may is formed on a substrate 5, which may comprise a sapphire, SiC, Si or GaN substrate containing an optional GaN or AlGaN expitaxial buffer layer 7. The mask 6 may comprise a layer of silicon nitride or silicon, oxide (20-50 nm in thickness) deposited by PECVD. Several techniques known in the art can be used to form the apertures 10A, 10B, such as electron beam lithography (EBL), nanoimprint lithography, optical lithography and reactive ion etching (RIE) or wet chemical etching methods. Preferably each of the apertures are 10 to 500 nm, such as 50 to 200 nm in size (i.e., diameter), have an area of 150 nm$^2$ to 0.5 microns$^2$, and are pitched (i.e., spaced) 0.5-5 μm apart. The templates 2 are selectively grown in the apertures 10 by MOCVD or another suitable method, comprising of group III or group V limited step that farther may be kinetically or mass flow limited, as described above. The templates 2 may comprise GaN or another III-nitride semiconductor material doped with a first (e.g., n-type) conductivity type dopant.

The active regions 4 (e.g., quantum well(s)) are grown on the templates 2 by MOCVD or another suitable method, and the junction forming element(s) 3, such as shells of the second (e.g., p-type) conductivity type are grown on the active regions. Preferably, the active regions 4 and the shells 3 are grown in the group III limited regime. The shells 3 may comprise p-type GaN and the active regions may comprise In$_x$Ga$_{1-x}$N quantum wells with a preselected ratio of In to Ga (i.e., where x varies between greater than zero and less than 1). InGaN has flexibility of peak emission wavelength between approximately 375 and 1100 nm based on the indium content. If desired, the quantum wells may comprise a quaternary material, such as InAlGaN or another suitable semiconductor material. InAlGaN extends the material flexibility of wavelength between approximately 200 and 1100 nm but introduces further challenges for high quality growth. The electrodes are then formed in electrical contact with the templates 2 and the shells 3 to complete the LED.

The arrays produced according to one aspect of the disclosure may be laid out such that groups (i.e., growth areas 8A, 8B, etc.) of LEDs 1 with different active region 4 band gaps in each area due to different in content of the active region are electrically addressable separately. In other words, different drive voltages or current can be applied to the different groups of LEDs in different growth areas. This is desirable since if the same drive voltage would be applied to all elements either the efficiency of some devices would be too low or an excess voltage would be applied to others, which would be inefficient from an energy usage point of view. Furthermore, some (e.g. one or more) of the groups of LEDs may be turned on while some other (e.g., one or more) groups of LEDs may be turned off to change the color of light emitted by the LED array. This may be accomplished by forming separate electrodes in contact with each LED group (e.g., with each growth area) and separately connecting the electrode pairs from each group to one or more voltage or current sources.

In an alternative embodiment, the different color light emitting LEDs in different growth areas may be electrically connected in series. For example, one or more areas 8A may be connected in series with one or more areas 8B.

In the fourth embodiment, each active region on a single template can be made to emit a plurality of wavelengths. A non-limiting example is shown in FIGS. 8A-8B where each active region is capable of emitting three wavelengths. This is achieved by a layout of the mask 6 aperture 10 pattern comprising rows of apertures 10. The apertures 10 in each row "r" are closely spaced to adjacent apertures, while there is a relatively large distance between rows "r". For example, the distance "y" between adjacent apertures in the same row "r" is at least two times larger, such as 2-10 times larger than the distance "x" between adjacent apertures in adjacent rows. Preferably the distance x between rows is least 2-3 times the width of the individual LEDs 1 shown in FIG. 7.

Thus, the LEDs 1 are provided in rows, where facets of individual templates are spaced from an adjacent template in the same row by a narrow distance "y" which retards/hampers In incorporation into the active regions 4. Therefore, the portion 4B of the active region 4 on the m-plane side facet of the template 2 that faces and adjacent LED 1 in the same row will have the least amount of indium and therefore will have the shortest emission wavelength (e.g., in the blue region). On the other hand, portions 4A of the active region 4 formed on the template 2 m-plane side facets facing to the side of the row (i.e., facing an adjacent row) where there are no close neighboring LEDs will be prone to incorporate more In. Thus, portions 4A of the active regions will have emission with a longer wavelength (e.g., in the green region) than portions 4B. Finally, the portion 4C of the active region 4 formed on the top p-plane facets of the templates 2 may emit the longest wavelength light (e.g., in the red region) due to the highest In incorporation in the active region on p-plane facets. If this high indium incorporation on the top p-plane facets of the nanowire templates 102 is not desired in the first through the third embodiments, then the templates 102 may be etched back to remove the sharp p-plane facet tip and to leave a planar c-plane top surface on the nanowire templates 102. The active region portions formed on the c-plane facets of the templates 102 do not preferentially incorporate indium during deposition.

As described above, LED emission color differences are controlled by local geometry of the substrate and local shapes and dimensions of templates on the substrate. To achieve a high quality rendition of white light, a difference in wavelength of up to 200 nm between the shortest and longest wavelength may be needed. To give a good rendition of blue/green, a difference in wavelength of up to 100 nm between the shortest and longest wavelength may be needed though lower differences may be advantageous.

While the devices are discussed in the context of multi-colored LEDs, the LED array may comprise single color LEDs over a range of wavelengths. Furthermore, even though many examples are given with the traditional division between blue, green and red, any multiple set of colors can be envisioned. For example, close laying colors may be venerated to provide substantially continuous spectrum mimicking black body emission types of light sources. Furthermore, the templates described above can be used for other devices, such as lasers, photodetectors, transistors, diodes, etc.

Multi-Step Selective Growth for Mask Independent Structure Design

As described above, when utilizing nanowire growth as first step for templates for 3D structures, the structure size and shape is still coupled to spacing and aperture size (local $A_g/A_m$) under Group III limited conditions. However, in embodiments of the disclosure, utilizing group V limited conditions, when growth is not rate limited by the Group III source material delivery, constant growth rate independent of spacing can also be achieved.

The same mechanisms as described above are true for mask aperture size. Aperture size will mainly affect template length and width, and especially in Group III-source material limited growth regimes, the template can be grown at a length independent of aperture size Thus, two-step growth have additional advantages as it gives the opportunity to, decouple global monotonous facet development and fabricate differently shaped semiconductor structures at different positions by varying aperture spacing and aperture size. It should be noted that the transition to radial growth on the side facets of the templates means a redefinition of the growth area in the sense that the nanowire side facets together with the top area of the nanowire are then used as growth area while the top area was the growth area during nanowire conditions.

The function of the nanowire growth can then be understood to constitute, a preparation of a template for defining growth area for the subsequent radial growth independently of spacing and aperture size, with much higher freedom than ordinary one-step growth where growth rate is directly dependent of spacing and aperture size and growth volume is constant. The layers provided as part of or on the nanowire core form a template for the provision of an active layer, and depending on the relative height of the nanowire the ratio between pyramid facets and side facets of the layers can be varied. Spacing will then increase the ratio of p/m plane at same template length, since a larger ratio of collection volume/mask area for each nucleation makes more material available during radial layer growth to the nanowire. By grouping the templates in different ways, such as by spacing and aperture size, different properties (height, width, facet area etc.) are achievable, giving primarily different emission wavelengths when ternary QWs are grown on these templates.

As described above, a method of making multi-color emitting LEDs includes defining a growth mask with a desired aperture pattern on a substrate. The growth mask can be a layer covering the substrate having apertures of different size and/or different spacing, the openings being grouped according to certain rules for obtaining the desired properties described above. The templates are selectively grown in growth regimes such that the lengths of the templates can be essentially independent of aperture spacing.

When templates have been grown as desired, i.e. a plurality nanowires and/or nanopyramids exhibiting various combinations of lengths, widths etc. at least one radial layer (e.g., active region and shell) are grown on the templates. As shown previously, the templates can also be fabricated where height can be made dependent or independent on aperture pitch depending on growth regime. This is also true for aperture size. Aperture, size will then mainly affect template length and width, but length can be made independent of aperture size.

At extreme conditions, where group III flow is high, as in many nanowire conditions, growth with small $A_m$, as with extremely large apertures, is however not feasible, and will result in low quality growth and often liquid III element droplets form on the surface.

As shown, in nanowire growth, when growth is not rate limited by the Group III source material delivery, constant growth rate independent of spacing can also be achieved.

The same mechanisms as described above are tree for mask aperture size. Aperture size will mainly affect template length and width, and especially in Group III-source material limited growth regimes, the template can be grown at a length independent of aperture size.

The apertures in the mask will normally have circular shape although other shapes are possible, such as hexagonal, or rectangular. Mask aperture size can be in the range of 10 nm-500 nm ("effective diameter"), or area 150 nm$^2$-0.5 µm$^2$.

The length/width ratio of a template has a direct effect on the c-plane/p-plane/m-plane area ratio of the radial layer, such as the active region QWs. Shorter templates give a larger pyramid part at the same volume of the underlayer grown. With extended growth and longer growth time, a pyramid shape is eventually formed at the expense of side facets, since p-plane exhibits the slowest growth rate. When only p-plane terminates the element, the volume growth rate will decrease. This effect is strong when source flows are higher than the p-plane growth rate allows. This can be used to additional advantage when fabricating smaller net volume groups at larger spacing, since the nanowire length will determine the pyramid height. The volume of pyramids can consequently be fully controlled by the nanowire length, when a full pyramid has been formed.

It should be noted that growth rate variations, caused by kinetic effects, such as improved local NH$_3$ cracking by increased exposure to GaN surface in the group V limited regime, are additional effects to the theory described above, as the theoretical discussion has been confined to the contribution surface ratios makes on growth rate when mass flow dominates. However, growth rate response to mass flow and kinetic hindrance are not mutually exclusive in any way, except when all kinetic barriers are minimized.

According to another aspect of the present disclosure, a monolithic substrate includes an array of emissive subpixels of at least two types, with each type emitting light of a different color. Such a substrate is termed an image chip. With three subpixel types and corresponding colors that are approximately red, green, and blue, the subpixel array on the image chip is capable of displaying full-color images.

The subpixels on the image chip may be electrically-driven two-terminal light-emitters, e.g. semiconductor diodes. The emitters may directly generate light of a target color. In this case, the structure and composition of the emitter may vary from subpixel to subpixel so that the different colors of the image chip can be realized.

Multicolor emission may be achieved using III-Nitride nano-emitters. These are formed by epitaxial growth on a substrate wafer having a growth mask with vias. During the growth process, deposition is avoided on the mask, and concentrates in the vias. A variety of structures can be realized using this approach, including wires, pyramids, as well as coalesced films.

Figure 10:
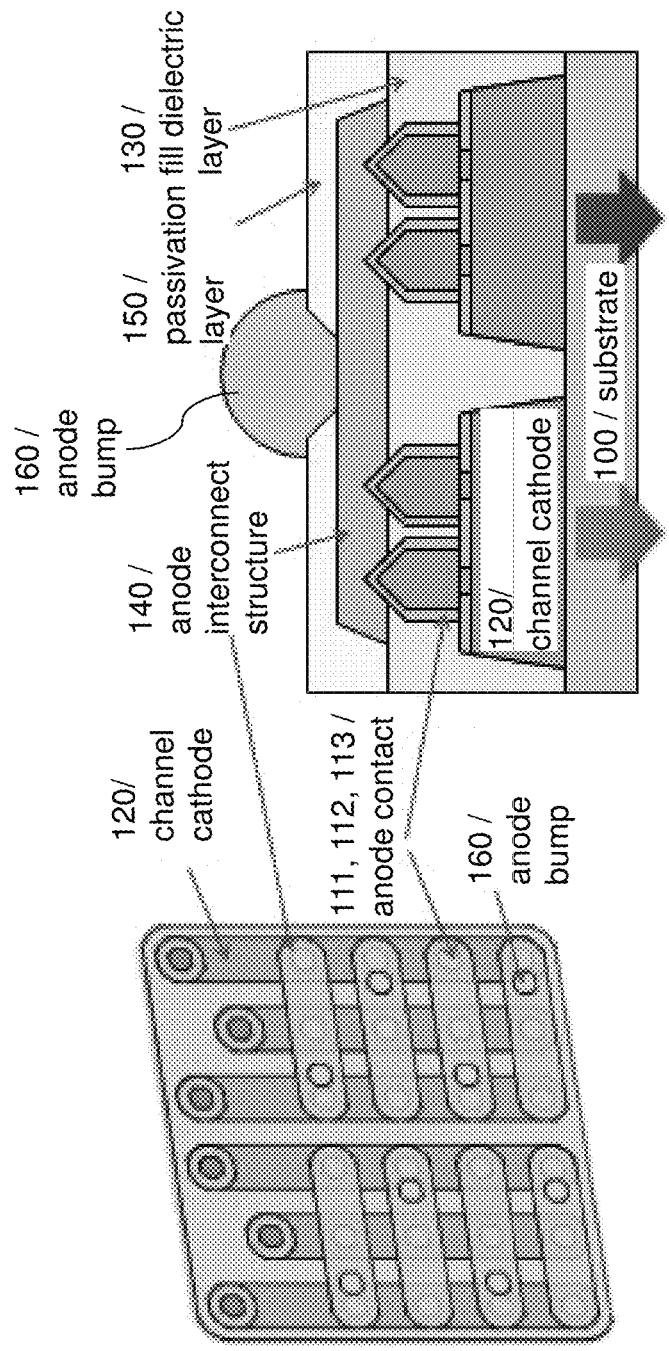
FIG. 10 illustrates an image chip architecture according to an embodiment. In this example, a 6-channel cathode yields interconnect pitch of about 10 microns.

FIG. 10 illustrates a cross-sectional view of a two-channel cathode image chip, which shows the image chip architecture. In this example, a 6-channel cathode 120 yields interconnect pitch of about 10 microns. To form this structure, an isolation etch process, a dielectric fill process, a planarization process, and processing steps for formation of interconnect structures may be employed.

The substrate 100 may be a sapphire layer, and the channel cathodes 120 may include n-type GaN. A multichannel cathode image chip may be fabricated, for example, using the following sequence of steps:
1. Deposit subpixel anode material over the structures illustrated in any of FIGS. 1A-8B, and pattern to keep only where needed to form the anode contacts (111, 112, 113).
2. Trench etch the n-type GaN down to the substrate to form isolated channel cathode lines, which constitute channel cathodes 120.
3. Fill the trenches with dielectric to form a fill dielectric layer 130.
4. Planarize the dielectric using e.g. CMP, exposing the tops of the subpixel anodes.
5. Deposit and pattern the anode interconnect metal to form anode interconnect structures 140.
6. Deposit and pattern a passivation dielectric material (such as silicon nitride or silicon oxide) to form a passivation layer 150.
7. Perform a wafer bumping process to form anode bumps 160.

Figure 11:
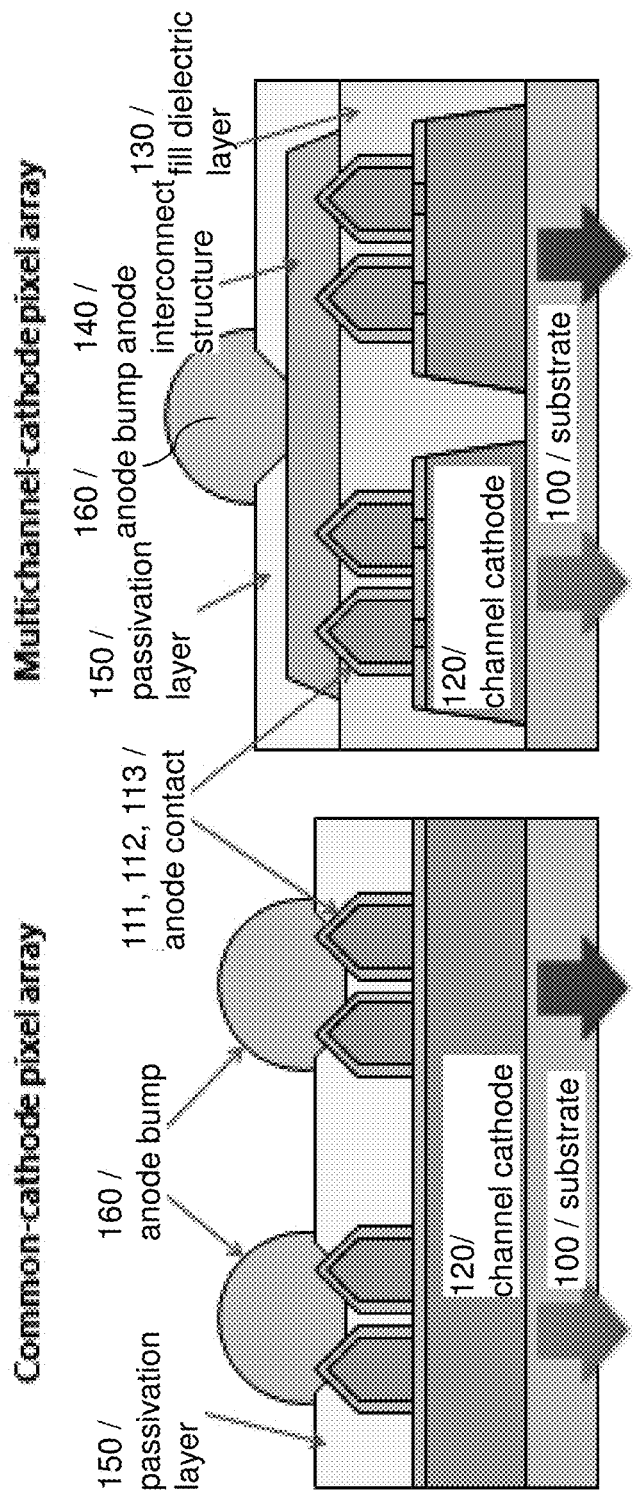
FIG. 11 illustrates examples of a common-cathode pixel array and a multichannel-cathode pixel array.

FIG. 11 compares a common-cathode pixel array and a multichannel-cathode pixel array. As far as device fabrication is concerned, the extra processing steps for the multichannel cathode may include an isolation etch process, a dielectric fill process, a planarization process, and processing steps for formation of interconnect structures. The processing steps for forming the fill dielectric layer 130 and the anode interconnect structures 140 are the additional steps employed for manufacture of the multichannel-cathode pixel array compared to manufacture of the common-cathode pixel array.

The subpixels on the image chip may be electrically-driven two-terminal light-emitters, e.g. semiconductor diodes. The emitters may directly generate light of a target color. In this case, the structure and composition of the emitter may vary from subpixel to subpixel so that the different colors of the image chip can be realized.

Multicolor emission may be achieved using III-Nitride nano-emitters. These are formed by epitaxial growth on a substrate wafer having a growth mask with vias. During the growth process, deposition is avoided on the mask, and concentrates in the vias. A variety of structures can be realized using this approach, including wires, pyramids, as well as coalesced films.

Figure 12:
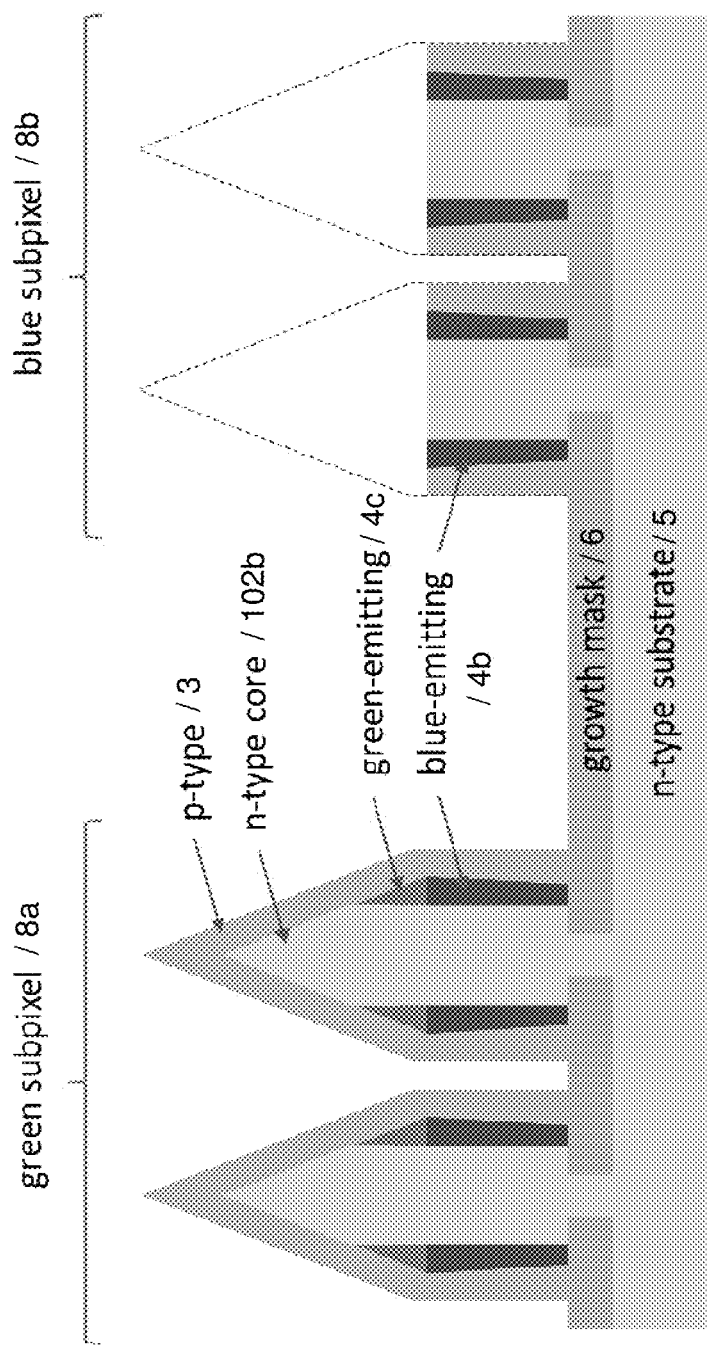
FIG. 12 illustrates green and blue subpixels created from core-shell nanowires having green-emitting and blue-emitting portions of the active region.

In one embodiment (FIG. 12), the subpixels include III-Nitride core-shell nanowires with an InGaN active region, wherein the nanowire is engineered so that a portion of the active region has a bandgap corresponding to a first, shorter wavelength, and a second portion of the wire has a bandgap corresponding to a second, longer wavelength. In some subpixels, these two portions may be driven in parallel; emission from the small-bandgap long-wavelength active region is energetically favored. Therefore, although both portions of the active region are driven, light emission from the long-wavelength portion will dominate. In other subpixels, the long-wavelength portion of the wire is removed by a fabrication process, and so these subpixels will generate only the short-wavelength light. In this way, an array of subpixels emitting light of different colors can be realized.

Figure 13:
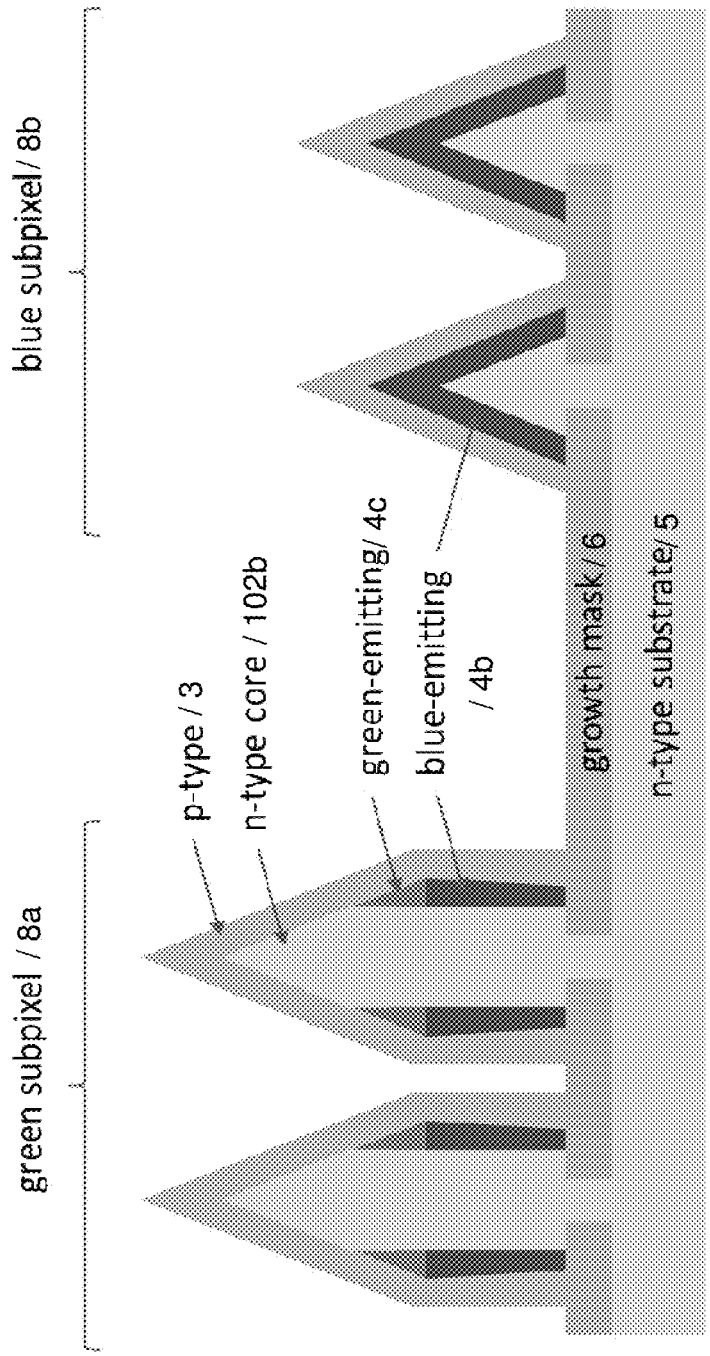
FIG. 13 illustrates green and blue subpixels wherein subpixels of different colors have different geometries formed by the growth process. The structural difference between the subpixels gives rise to the difference in emitted color. Contact layers are not shown.

In a second embodiment (FIG. 13), the subpixels include III-Nitride nanostructures, wherein the structure and geometry varies from subpixel to subpixel. Such variations may include (1) the height, diameter, or pitch of nanowires, (2) structure variation, e.g. free-standing nanowires in one subpixel type and pyramids in a second subpixel type. In this embodiment, the structural differences are the product of the epitaxial growth process and may be the result of local differences in the growth mask. Examples of nanostructures that may be formed to emit light of different wavelengths (e.g., colors) are described above with reference to FIGS. 1A-8B, for example.

Alternately, the subpixel emitters may include a pump that generates light corresponding to shorter wavelengths and higher energy, and a conversion medium that converts pump light to the final target color. Such a conversion medium may include inorganic phosphor materials, organic luminescent materials, quantum dots, or other semiconductor structure. Multiple conversion materials may be used in the display to achieve the various-color subpixels in a display. In a display, a conversion material may be used to generate one particular color, while direct emission is used to generate additional colors.

Figure 14:
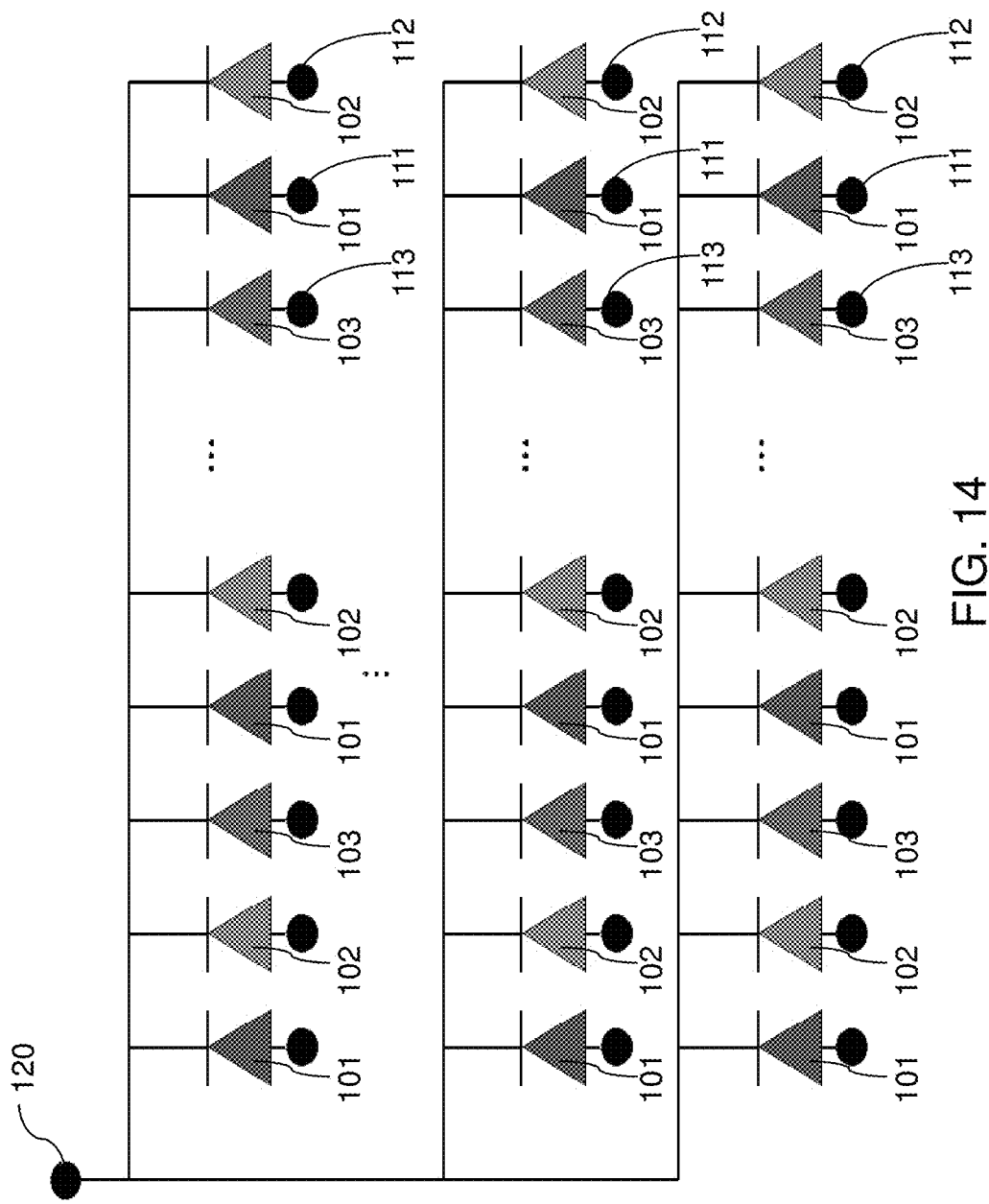
FIG. 14 is a circuit diagram for a common-cathode image chip.

On the image chip, each subpixel may be accessed independently using an appropriate combination of contact structures. A circuit diagram of such an image chip is shown in FIG. 14. In some schemes, each subpixel (101, 102, or 103) is provided its own anode contact (111, 112, 113), with the cathode 120 being shared amongst all subpixels in the array. Each subpixel (101, 102, or 103) can include a light emitting device, which may be a blue light emitting device 101, a green light emitting device 102, or a red light emitting device 103.

Figure 15:
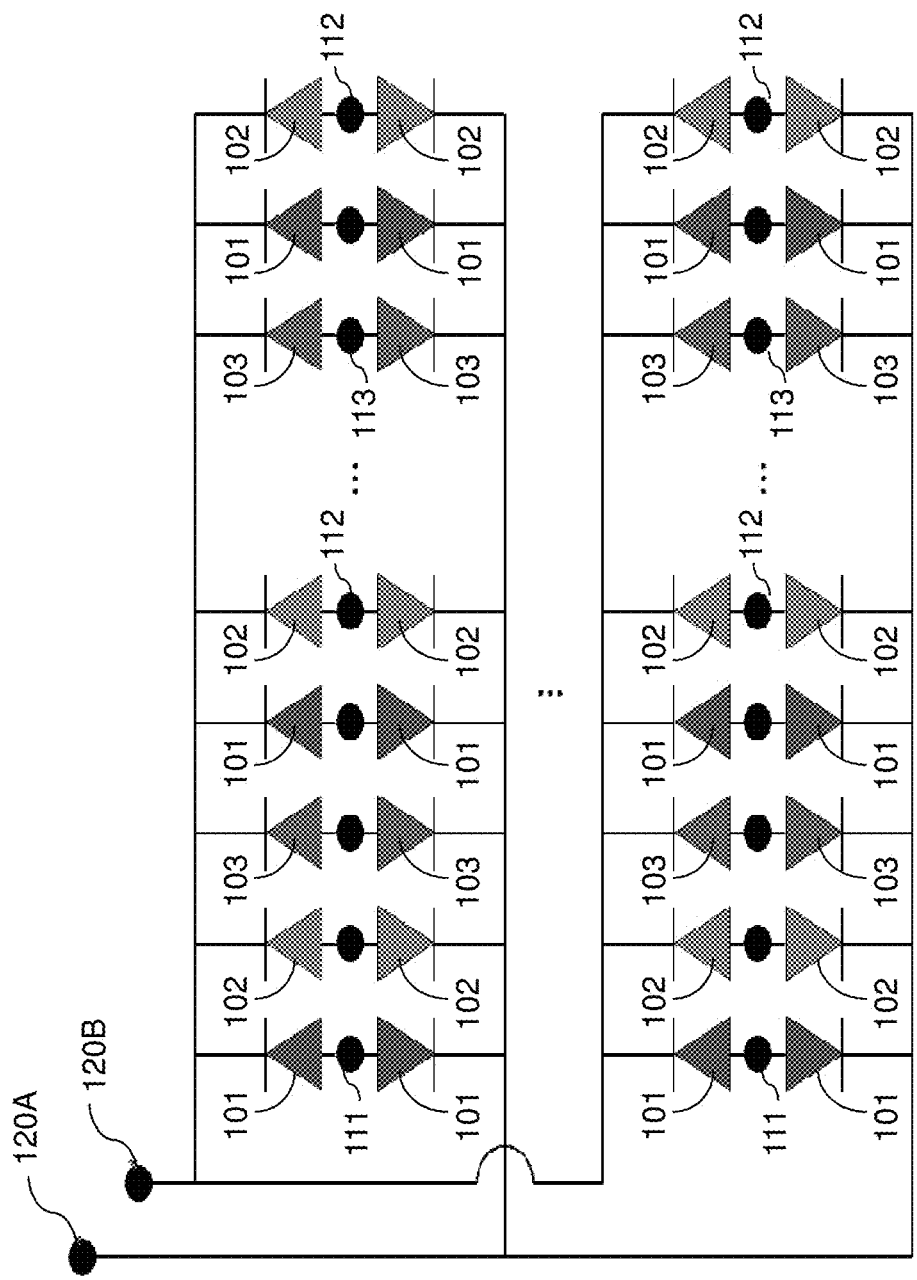
FIG. 15 is a circuit diagram for two-channel-cathode image chip.

In other schemes, several subpixels share a single anode contact point, but have independent cathode contacts. An image chip having such a design is termed a multichannel cathode image chip. A circuit diagram of a two-channel cathode design is shown in FIG. 15. The multichannel cathodes include at least a first cathode 120A and a second cathode 120B that are connected to a same set of anode contacts (111, 112, 113), in this multichannel cathode case, the subpixels (101, 102, 103) sharing a given anode contact (111, 112, 113) are driven in a sequential fashion. The advantage of the multichannel cathode is that the number of contact points on the image chip is reduced.

Figure 16:
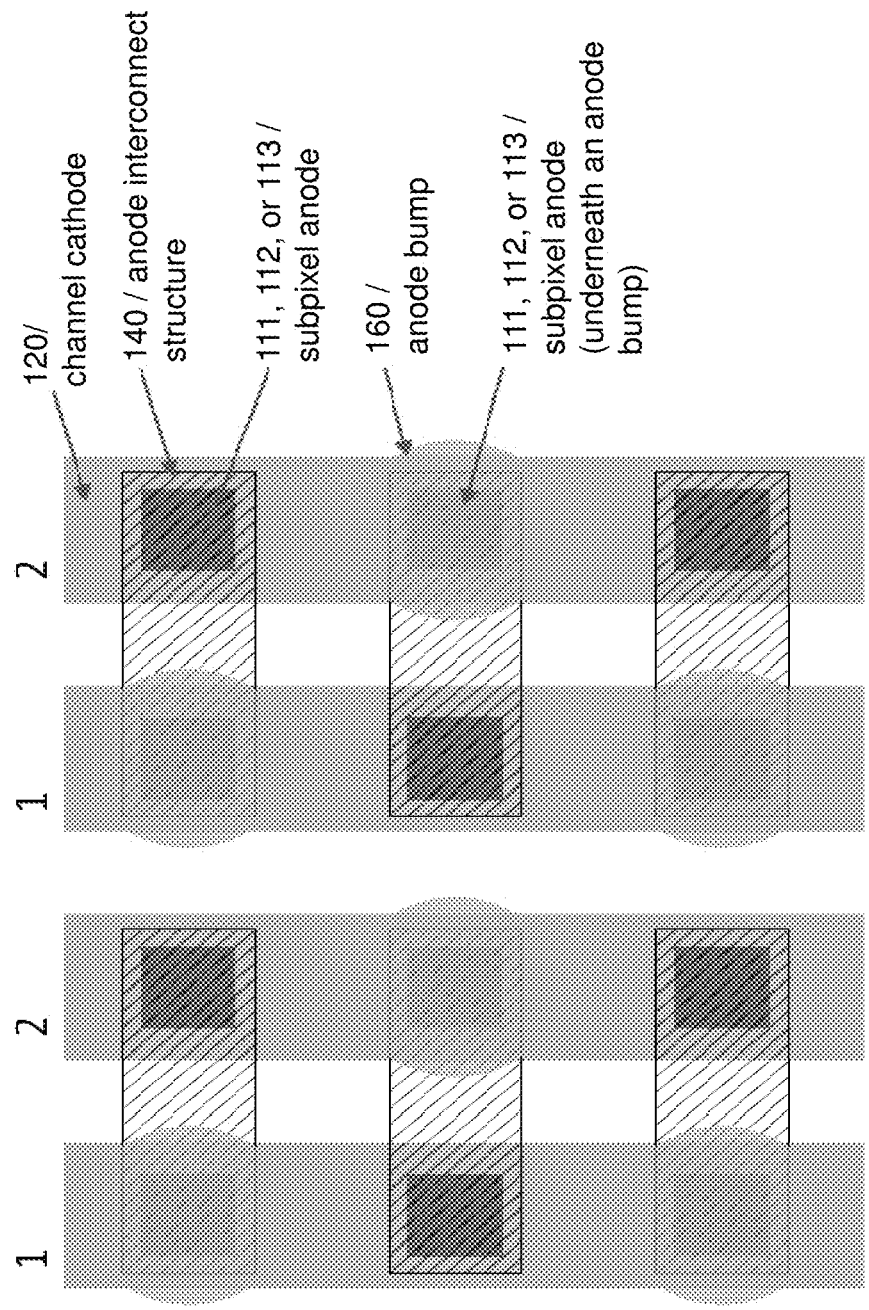
FIG. 16 is a top-down schematic depiction of several subpixels within a two-channel cathode image chip. The chip has vertical cathode lines and horizontal anode interconnects.

FIG. 16 shows a top-down schematic depiction of several subpixels within the array of a two-channel cathode image chip. FIG. 16 illustrates the subpixel anodes 111, 112, 113, the cathode lines 120 and anode interconnects 140, and the metal bumps 160 which serve as the contact points for each anode pair.

FIG. 17 shows a cross-section of the two-channel cathode image chip. The structure shown in FIG. 17 may be fabricated using the following sequence of steps:
1. Deposit subpixel anode material over the structures illustrated in any of FIGS. 1A-8B, and pattern to keep only where needed to form the anode contacts (111, 112, 113).
2. Trench etch the n-type GaN down to the substrate to form isolated channel cathode lines, which constitute channel cathodes 120.
3. Fill the trenches with dielectric to form a fill dielectric layer 130.
4. Planarize the dielectric using e.g. CMP, exposing the tops of the subpixel anodes.
5. Deposit and pattern the anode interconnect metal to form anode interconnect structures 140.
6. Deposit and pattern a passivation dielectric material (such as silicon nitride or silicon oxide) to form a passivation layer 150.
7. Perform a wafer bumping process to form anode bumps 160.

In one possible modification of this process, the dielectric fill may consist of multiple films, including e.g. a dielectric used as a hardmask to facilitate the trench etch of n-type GaN.

Optionally, the original epitaxial substrate may be removed from the image chip, which may enhance the light-extraction efficiency and minimize waveguiding of light within the image chip. Waveguiding will affect the local contrast ratio that can be achieved in an image chip, as a portion of the light emitted by a pixel within the array will be extracted at a remote location, giving finite brightness at the remote pixel location even if they are not actively powered. A second variation of the structure uses metal routing that acts as the cathode line, and eliminates the need of the n-GaN semiconductor to carry current. This would allow full singulation of GaN, further reducing waveguiding and improving image quality.

In an application, the image chip may be mated to a backplane that drives the subpixels to display an image. This mating process may utilize wafer-to-wafer bonding, chip-to-wafer bonding, or chip-to-chip bonding.

All references to top, bottom, base, lateral, etc are introduced for the easy of understanding only, and should not be considered as limiting to specific orientation. Furthermore, the dimensions of the structures in the drawings are not necessarily to scale.

According to various embodiments of the present disclosure, a semiconductor structure including light emitting devices is provided. The light emitting devices include at least a first light emitting device (such as nanowire LED 1 in FIG. 7) containing a first nanowire 102b located on a substrate 5. The first light emitting device comprises a first active region (such as the combination of a blue emitting region and a green emitting region in FIGS. 12 and 13 or element 4 in FIG. 7). The first active region includes a first lower active region (such as a blue emitting region in FIGS. 12 and 13 or element 4a in FIGS. 8A and 8B) having a first band gap and the first upper active region (such as a green emitting region in FIGS. 12 and 13 or element 4c in FIGS. 8A and 8B) having a second band gap. The first band gap is greater than the second band gap. The light emitting devices include at least a second light emitting device containing a second nanowire located on the substrate 5. The second light emitting device comprises a second active region (such as a blue emitting region in FIGS. 12 and 13) having the first band gap and does not include, nor is in physical contact with, any material having the second band gap.

In one embodiment, the first active region comprises a first III-V compound semiconductor material, and the second active region comprises a second III-V compound semiconductor material. In one embodiment, the first III-V compound semiconductor material provides light emission at a first peak emission wavelength, and the second III-V compound semiconductor material provides light emission at a second peak emission wavelength that is longer than the first peak emission wavelength.

In one embodiment, the first nanowire comprises a first growth template 102b including a first nanowire core, the second nanowire comprises a second growth template 102a including a second nanowire core, and the first nanowire core and the second nanowire core comprise a semiconductor material having a first conductivity type. The first conductivity type can be p-type or n-type. The first lower active region (such as 4*b*) can be located around a lower portion of the first nanowire core and comprises at least one first quantum well that has the first band gap. The first upper active region (such as 4*c*) can be located around an upper portion of the first nanowire core and comprises at least one second quantum well that has the second band gap. The second active region can be located around the second nanowire core and comprises at least another first quantum well that has the first band gap. In one embodiment, the first nanowire core and the second nanowire core can comprise gallium nitride, the at least one first quantum well and the at least another first quantum well can comprise indium gallium nitride having the first band gap, and the at least one second quantum well can comprise indium gallium nitride having the second band gap.

In one embodiment, a growth mask 6 can be located on the substrate 5. The growth mask 6 can include a first aperture and a second aperture therein. The first nanowire core can be epitaxially aligned to a single crystalline semiconductor material of the substrate. The second nanowire core can be epitaxially aligned to the single crystalline semiconductor material of the substrate. In one embodiment, the light emitting devices can comprise at least one first growth template located around the first nanowire core and extending laterally beyond the first aperture over the growth mask, and at least one second growth template located around the second nanowire core and extending laterally beyond the second aperture over the growth mask.

In one embodiment, the first growth template and the second growth template differ from each other by at least one of a respective growth area defined by an area of the first aperture and an area of the second aperture, respectively; a respective facet area for a same type of crystallographic plane; and a respective nearest-neighbor spacing from adjacent growth templates that are present on the substrate. In one embodiment, the first aperture has an area that is at least twice the area of the second aperture.

In one embodiment, the light emitting devices can further comprise a first junction forming element 3 having a doping of a second conductivity type that is the opposite of the first conductivity type and located around the first active region to provide a first junction selected from a p-n junction and a p-i-n junction, and a second junction forming element having a doping of the second conductivity type and located around the second active region to provide a second junction selected from a p-n junction and a p-i-n junction.

In one embodiment, the first growth template can comprise a III-V compound semiconductor material and can have m-planes as sidewalls and p-planes as faceted top surfaces, and the second growth template can comprise the III-V compound semiconductor material and has in-planes as sidewalls and a generally horizontal top surface.

In one embodiment, the first growth template comprises a III-V compound semiconductor material and has m-planes as sidewalls and p-planes as faceted top surfaces, and the second growth template comprises the III-V compound semiconductor material and has p-planes as faceted surfaces that are adjoined at an apex. In one embodiment, the first nanowire core is epitaxially aligned to a single crystalline semiconductor material of the substrate, the second nanowire core is epitaxially aligned to the single crystalline semiconductor material of the substrate, and a bottom periphery of the p-planes of the second growth template contacts a top surface of the growth mask.

In one embodiment, the light emitting devices can include a third light emitting device comprising a nanopyramid growth template 2*c* located on the substrate (as illustrated in FIGS. 3A and 3B), and a third active region (e.g., a red emitting region) having a third band gap that is less than the second band gap. The growth mask 6 can include a third aperture therein. The first nanowire core can be epitaxially aligned to a single crystalline semiconductor material of the substrate, the second nanowire core can be epitaxially aligned to the single crystalline semiconductor material of the substrate, and the nanopyramid growth template can be epitaxially aligned to the single crystalline semiconductor material of the substrate.

In one embodiment, additional light emitting devices can be present on the substrate around each of the first, second, and third light emitting devices. The third aperture can have an area that is substantially the same as second aperture. As used herein, two areas are substantially the same if each area is with 20% of the average of the two areas. The nearest-neighbor spacing of the third light emitting device from other light emitting devices of the semiconductor device is greater than respective nearest-neighbor spacings of the first and second light emitting devices.

In one embodiment, the first growth template comprises a III-V compound semiconductor material and has m-planes as sidewalk and p-planes as faceted top surfaces, the second growth template comprises the III-V compound semiconductor material and has p-planes as faceted surfaces that are adjoined at an apex, the nanopyramid growth template comprises the III-V compound semiconductor material and has p-planes as faceted surfaces that are adjoined at an apex; the semiconductor structure further comprises a growth mask located on the substrate, and a bottom periphery of the p-planes of the nanopyramid growth template contacts a top surface of the growth mask as illustrated in FIGS. 3A and 3B.

In one embodiment, the light emitting devices constitute a two-dimensional pixel array as illustrated in FIGS. 14-16. Each pixel in the two-dimensional pixel array can include one instance of the first light emitting device, one instance of the second light emitting device, and one instance of the third light emitting device.

According to various embodiments of the present disclosure, a method of making a semiconductor device comprising light emitting devices is provided. A growth mask 6 having a first aperture in a first area and a second aperture in a second area is formed on a substrate 5. A first nanowire is formed through the first aperture. The first nanowire comprises a first active region including a first lower active region and a first upper active region. The first nanowire 8*b* comprises a first active region (such as the combination of a blue emitting region and a green emitting region in FIGS. 12 and 13 or element 4 in FIG. 7). The first active region includes a first lower active region (such as a blue emitting region in FIGS. 12 and 13 or element 4*a* in FIGS. 8A and 8B) having a first band gap and the first upper active region (such as a green emitting region in FIGS. 12 and 13 or element 4*c* in FIGS. 8A and 8B) having a second band gap. The first band gap is greater than the second band gap. A second nanowire is formed through the second aperture. The second nanowire comprises a second active region (such as a blue emitting region in FIGS. 12 and 13) having the first band gap and does not include, nor is in physical contact with, any material having the second band gap.

The first nanowire and the second nanowire may be provided by forming a first growth template comprising a III-V compound semiconductor material through the first aperture, and forming a second growth template comprising the compound semiconductor material through the second aperture. The first active region and the second active region can be formed by simultaneous deposition of III-V semiconductor materials having different compositions. The first active region can comprise a first III-V compound semiconductor material that provides light emission at a first peak emission wavelength, and the second active region can comprise a second III-V compound semiconductor material that provides light emission at a second peak emission wavelength that is longer than the first peak emission wavelength.

A first nanowire core and a second nanowire core may be formed by epitaxially growing a semiconductor material having a first conductivity type on the substrate. The first lower active region, the first upper active region, and the second active region may be formed simultaneously by growing another semiconductor material. The first lower active region may be formed on, and around, a lower portion of the first nanowire core and comprises at least one first quantum well that has the first band gap. The first upper active region may be formed on, and around, an upper portion of the first nanowire core and comprises at least one second quantum well that has the second band gap. The second active region may be formed on, and around, the second nanowire core and comprises at least another first quantum well that has the first band gap.

In one embodiment, the first nanowire core and the second nanowire core are formed by growing gallium nitride on the semiconductor substrate. The first quantum wells of the first and second light emitting devices may be formed by depositing indium gallium nitride having the first band gap. The second quantum well may be formed by depositing indium gallium nitride having the second band gap. The first quantum wells and the second quantum wells may be simultaneously deposited with different composition due to differences in the deposited material while employing a same set of deposition precursors, where the differences in the band gaps between the first quantum well and the second quantum well may be produced by the differences in at least one of a respective growth area defined by an area of the first aperture and an area of the second aperture, respectively; a respective facet area for a same type of crystallographic plane; and a respective nearest-neighbor spacing from adjacent growth templates that are present on the substrate.

An image chip comprising a semiconductor structure of the present disclosure is also provided. In one embodiment, the semiconductor structure may include a substrate, such as a monolithic substrate, and the light emitting devices may constitute an array of emissive subpixels of at least two types located upon the monolithic substrate. In addition, the methods of the present disclosure may be employed to manufacture an image chip that includes the semiconductor structure.

While the disclosure has been described in connection with what is presently considered to be the most practical and preferred embodiments, it is to be understood that the disclosure is not to be limited to the disclosed embodiments, on the contrary, it is intended to cover various modifications and equivalent arrangements within the scope of the appended claims.

The invention claimed is:

1. A display device including light emitting devices, comprising:
   a first light emitting device containing a first semiconductor active region located over a substrate, wherein the first semiconductor active region has a first band gap that emits light at a first wavelength; and
   a second light emitting device containing a second semiconductor active region located over the substrate and a conversion medium overlying the second semiconductor active region, wherein the conversion medium converts a shorter wavelength light emitted from the second semiconductor active region to a light having a target color having a second wavelength that is longer than the first wavelength and is longer than the shorter wavelength.

2. The display device of claim 1, wherein direct emission from the first light emitting device generates an additional color having the first wavelength to achieve different color subpixels in a display.

3. The display device of claim 2, wherein the conversion medium comprises an inorganic phosphor, organic luminescent material or quantum dots.

4. The display device of claim 1, wherein:
   the first active region comprises a first III-V compound semiconductor material; and
   the second active region comprises a second III-V compound semiconductor material.

5. The display device of claim 4, wherein each of the first semiconductor active region and the second semiconductor active region comprises at least one indium gallium nitride material.

6. The display device of claim 5, wherein each of the first semiconductor active region and the second semiconductor active region comprises a respective quantum well including indium gallium nitride layers.

* * * * *